(12) United States Patent
Cho et al.

(10) Patent No.: US 7,738,622 B2
(45) Date of Patent: Jun. 15, 2010

(54) SHIFT REGISTER

(75) Inventors: Hyung Nyuck Cho, Incheon-si (KR); Yong Ho Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 26 days.

(21) Appl. No.: 11/812,999

(22) Filed: Jun. 22, 2007

(65) Prior Publication Data

US 2007/0297559 A1 Dec. 27, 2007

(30) Foreign Application Priority Data

Jun. 23, 2006 (KR) ............... 10-2006-0056862
Oct. 16, 2006 (KR) ............... 10-2006-0100285

(51) Int. Cl.
*G11C 19/00* (2006.01)

(52) U.S. Cl. ............... 377/64; 377/68; 377/69

(58) Field of Classification Search ............ None
See application file for complete search history.

(56) References Cited

U.S. PATENT DOCUMENTS

| | | | |
|---|---|---|---|
| 4,084,106 A * | 4/1978 | Ullrich | 377/79 |
| 6,339,631 B1 * | 1/2002 | Yeo et al. | 377/64 |
| 6,621,481 B1 * | 9/2003 | Kanbara | 345/100 |
| 6,970,530 B1 * | 11/2005 | Wang et al. | 377/69 |
| 7,420,536 B2 * | 9/2008 | Jang et al. | 345/100 |
| 2005/0008114 A1 * | 1/2005 | Moon | 377/64 |
| 2007/0019775 A1 * | 1/2007 | Tsai et al. | 377/64 |

* cited by examiner

*Primary Examiner*—Tuan Lam
(74) *Attorney, Agent, or Firm*—Morgan, Lewis & Bockius LLP

(57) ABSTRACT

A shift register is disclosed, which can prevent a multi-output caused by a coupling phenomenon, the shift register comprising at least two clock transmission lines which transmit at least two clock pulses provided with the phase difference; and a plurality of stages which are supplied with the clock pulses from the clock transmission lines, and output output-signals in sequence, wherein each of the stages comprises a pull-up switching unit which is supplied with the first clock pulse, and outputs the first clock pulse as the output-signal according to a signal state of an enable node; and a noise eliminating unit which responds to the second clock pulse of which phase is prior to that of the first clock pulse supplied to the pull-up switching unit, and supplies a start pulse externally provided or the output-signal provided from the preceding stage to the enable node.

5 Claims, 21 Drawing Sheets (a)

(b)

(c)

SHIFT REGISTER

This application claims the benefit of Korean Patent Application No. 2006-56862 filed Jun. 23, 2006, which is hereby incorporated by reference as if fully set forth herein.

BACKGROUND OF THE INVENTION

1. Field of the Invention

The present invention relates to a shift register of a liquid crystal display (LCD) device, and more particularly, to a shift register which can prevent a multi-output caused by a coupling phenomenon.

2. Discussion of the Related Art

In general, a liquid crystal display (LCD) device displays images by controlling light transmittance of liquid crystal with the use of an electric field. For this, the LCD device is provided with an LCD panel including a plurality of pixel regions arranged in a matrix, and a driving circuit for driving the LCD panel.

The LCD panel comprises a plurality of gate lines crossing a plurality of data lines to define a plurality of pixel regions. A thin film transistor (TFT) is provided in each pixel region. A plurality of pixel electrodes and a common electrode are formed in the LCD panel to apply the electric field to the respective pixel regions. Each of the pixel electrodes is connected with one of the data lines through drain and source terminals of the corresponding thin film transistor (TFT) which functions as a switching device. The thin film transistor (TFT) is turned-on by an output pulse applied to a gate terminal thereof through the gate line, while a data signal from the data line is charged in a pixel voltage.

The driving circuit comprises a gate driver for driving the gate lines; a data driver for driving the data lines; a timing controller for supplying control signals to control the gate and data drivers; and a power supply for supplying driving voltages for the LCD device.

The timing controller controls the driving timing of the gate and data drivers, and supplies pixel data signals to the data driver. The power supply generates driving voltages such as a common voltage, a gate high-voltage signal (VGH) and a gate low-voltage signal (VGL) by raising or reducing an input power. The gate driver supplies output pulses to the gate lines in sequence, to thereby sequentially drive liquid crystal cells of the LCD panel by one line. The data driver supplies a pixel voltage signal to each of the data lines whenever the output pulse is supplied to any one of the gate lines. Accordingly, the LCD device displays images by controlling the light transmittance with the electric field applied between the pixel electrode and the common electrode according to the pixel voltage signal by each liquid crystal cell.

At this time, the gate driver comprises a shift register to output the scan pulses in sequence. The related art shift register is comprised of 'n' stages which are subordinately connected to one another. In this case, each of the stages outputs one scan pulse. The scan pulses outputted from the respective stages are sequentially supplied to the gate lines of the LCD panel (not shown), to thereby scan the gate lines in sequence.

FIG. 1 illustrates a circuit structure included in a stage according to the related art. Each stage is comprised of a node control unit 101 which controls the charge and discharge state in an enable node (Q) and a disable node (QB); a pull-up switching unit (Trpu) which outputs an output pulse (Vout) according to the signal state of the enable node (Q); and a pull-down switching unit (Trpd) which outputs a discharging voltage source (VSS) according to the signal state of the disable node (QB). At this time, the enable node (Q) and the disable node (QB) are alternately charged and discharged. In detail, when the enable node (Q) is charged, the disable node (QB) is discharged. In the meantime, when the disable node (QB) is charged, the enable node (Q) is discharged. Also, when the enable node (Q) is charged, the pull-up switching unit (Trpu) outputs the output pulse (Vout). When the disable node (QB) is charged, the pull-down switching unit (Trpd) outputs the discharging voltage source (VSS).

Then, the output pulse (Vout) outputted from the pull-up switching unit (Trpu) and the discharging voltage source (VSS) outputted from the pull-down switching unit (Trpd) are supplied to the corresponding gate line. At this time, a gate terminal of the pull-up switching unit (Trpu) is connected with the enable node (Q); a drain terminal of the pull-up switching unit (Trpu) is connected with a clock transmission line to which the clock pulse is applied; and a source terminal of the pull-up switching unit (Trpu) is connected with the gate line. The clock pulse (CLK) is provided with the high and low states periodically, and the clock pulse (CLK) is supplied to the drain terminal of the pull-up switching unit (Trpu). At this time, the pull-up switching unit (Trpu) outputs any one of the high-state clock pulses (CLK) inputted by each period at a predetermined point. The clock pulse (CLK) outputted at the predetermined point corresponds to the output pulse (Vout) to drive the gate line.

The predetermined point corresponds to a point in which the enable node (Q) is charged. That is, among the clock pulses (CLK) periodically inputted to the drain terminal of the pull-up switching unit (Trpu), the pull-up switching unit (Trpu) outputs the high-state clock pulse (CLK) inputted at the predetermined point (the point in which the enable node (Q) is charged) as the output pulse (Vout). According as the enable node (Q) is maintained as the discharge state until the next frame is started after the output of the output pulse (Vout), the pull-up switching unit (Trpu) outputs one output pulse (Vout) by each frame. However, since the clock pulse (CLK) is outputted several times during one frame, the clock pulse (CLK) is continuously inputted to the drain terminal of the pull-up switching unit (Trpu) even in the turn-off state of the pull-up switching unit (Trpu), i.e., even in the discharge state of the enable node (Q). In other words, the pull-up switching unit (Trpu) is turned-on once during one frame, and also the pull-up switching unit outputs the clock pulse (CLK), which is inputted to its own drain terminal during the turn-on period, as the output pulse (Vout).

After that, the pull-up switching unit (Trpu) is turned-off until the next frame is started. Thus, the pull-up switching unit can not output the clock pulse (CLK) as the output pulse (Vout) even though the clock pulse is inputted to the drain terminal of the pull-up switching unit during the turn-off period. According as the clock pulse (CLK) is periodically applied to the drain terminal of the pull-up switching unit (Trpu), the coupling phenomenon occurs between the enable node (Q) connected with the gate terminal of the pull-up switching unit (Trpu) and the drain terminal of the pull-up switching unit (Trpu). By the coupling phenomenon, the enable node (Q) is continuously charged with the predetermined voltage according to the clock pulse (CLK). That is, the enable node (Q) is maintained in the charge state even at the undesired timing. In this case, the enable node (Q) may be charged two or more times during one frame, whereby the pull-up switching unit (Trpu) may be turned-on two or more times during one frame. Eventually, one stage outputs the output pulses (Vout) two or more times during one frame, thereby causing the multi-output. Accordingly, if one stage outputs the output pulses (Vout) two or more times during one frame, the picture quality of images displayed on the LCD panel is deteriorated.

SUMMARY OF THE INVENTION

Accordingly, the present invention is directed to a shift register that substantially obviates one or more problems due to limitations and disadvantages of the related art.

An object of the present invention is to provide a shift register which can prevent a multi-output caused by a coupling phenomenon.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register comprises at least two clock transmission lines which transmit at least two clock pulses provided with the phase difference; and a plurality of stages which are supplied with the clock pulses from the clock transmission lines, and output output-signals in sequence, wherein each of the stages comprises a pull-up switching unit which is supplied with the first clock pulse, and outputs the first clock pulse as the output-signal according to a signal state of an enable node; and a noise eliminating unit which responds to the second clock pulse of which phase is prior to that of the first clock pulse supplied to the pull-up switching unit, and supplies a start pulse externally provided or the output-signal provided from the preceding stage to the enable node.

In another aspect, a shift register comprises at least two clock transmission lines which transmit at least two clock pulses provided with the phase difference; and a plurality of stages which are supplied with the clock pulses from the clock transmission lines, and output output-signals in sequence, wherein each of the stages comprises a pull-up switching unit which is supplied with the first clock pulse, and outputs the first clock pulse as the output-signal according to a signal state of an enable node; a pull-down switching unit which outputs a discharging voltage source according to a signal state of a disable node; a node control unit which controls the enable node and the disable node according to output signals from the preceding stage and the next stage; and a noise eliminating unit which supplies the output signal from the preceding stage to the enable node in response to the second clock pulse of which phase is prior to that of the first clock pulse supplied to the pull-up switching unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a shift register according to the preferred embodiments of the present invention will be described with reference to the accompanying drawings.

Figure 1:
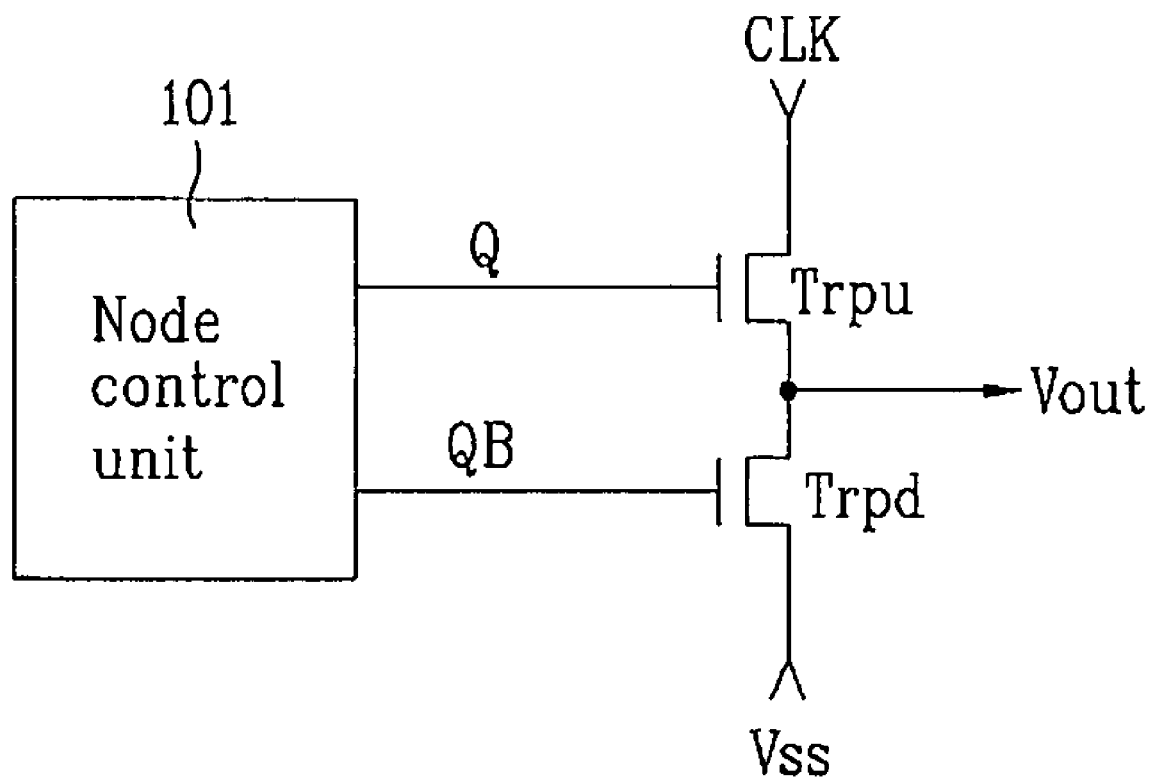
FIG. 1 illustrates a circuit structure included in a stage according to the related art.
Figure 2:
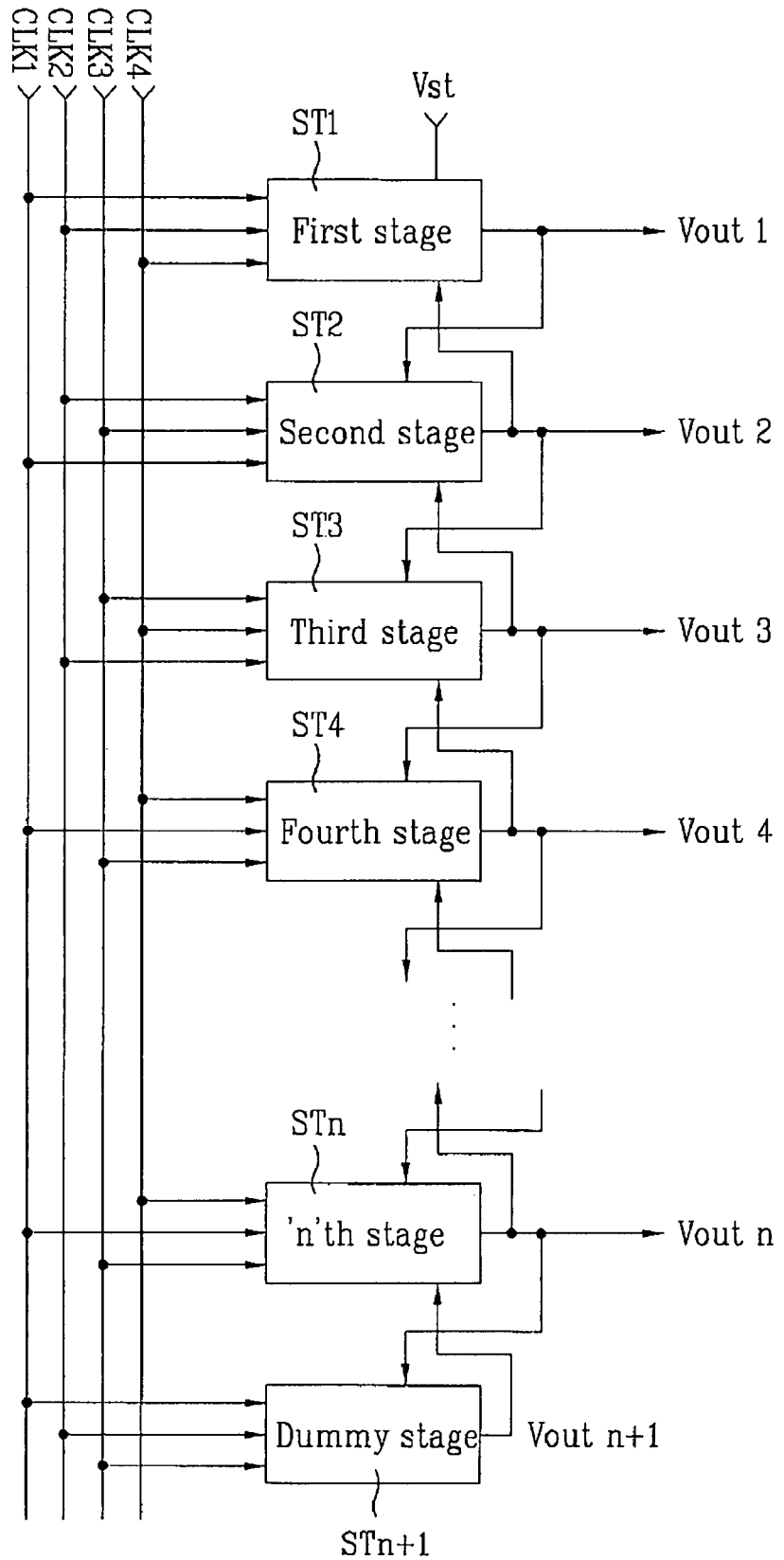
FIG. 2 illustrates a shift register according to the first embodiment of the present invention.
Figure 3:
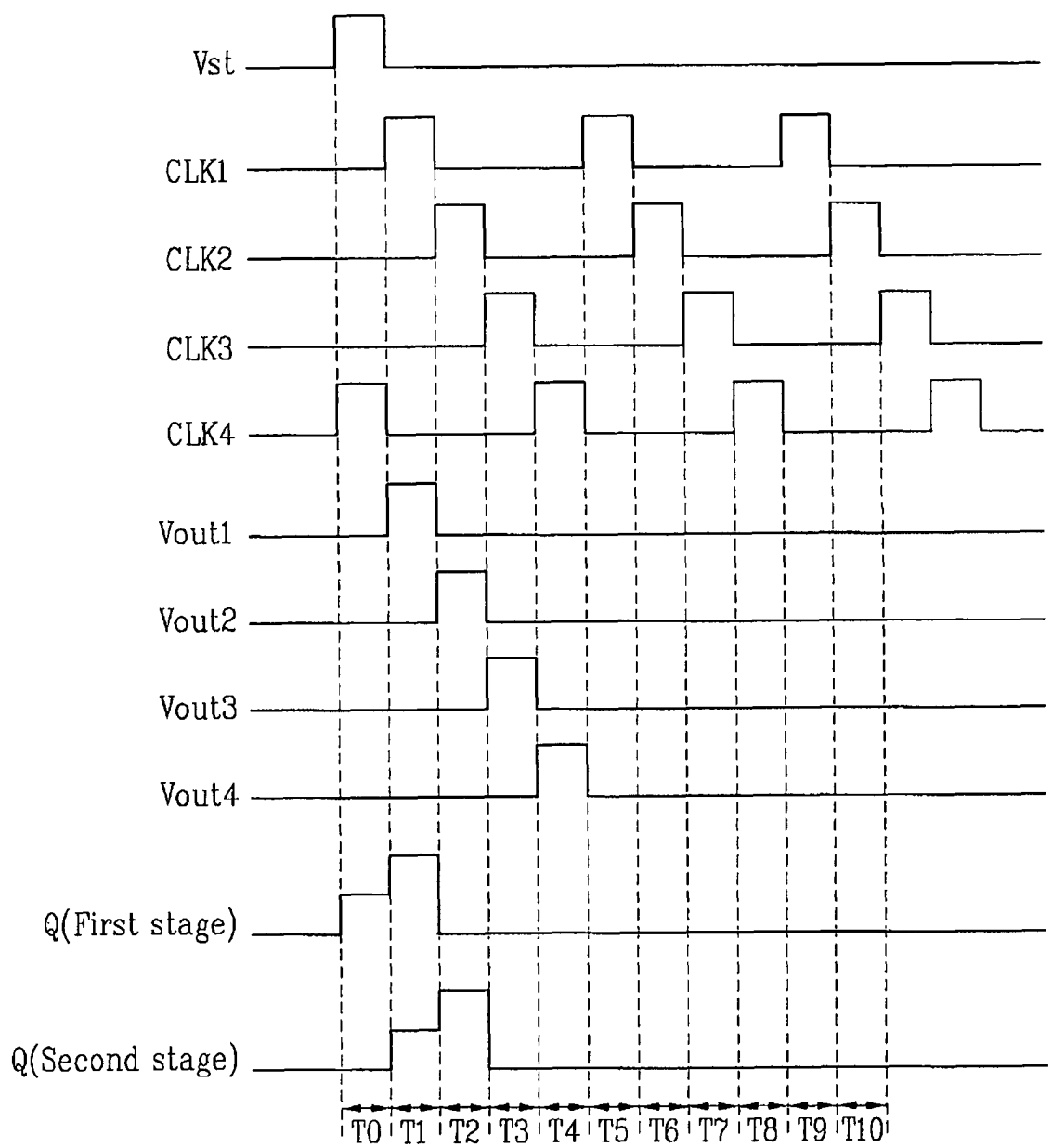
FIG. 3 illustrates a timing view of signals supplied to and outputted from the shift register of FIG. 2.

FIG. 2 illustrates a shift register according to the first embodiment of the present invention. FIG. 3 illustrates a timing view of signals supplied to and outputted from the shift register of FIG. 2.

As shown in FIG. 2, the shift register according to the first embodiment of the present invention is comprised of 'n' stages (ST1 to STn) subordinately connected with one another, and one dummy stage (STn+1). At this time, each of the stages (ST1 to STn+1) outputs one output pulse (Vout1 to Voutn+1) during one frame. For example, the first to dummy stages (ST1 to STn+1) respectively output the output pulses in sequence. The output pulses (Vout1 to Voutn) outputted from the stages (ST1 to STn) except the dummy stage (STn+1) are sequentially supplied to the gate lines, to thereby scan the gate lines in sequence. That is, the first stage (ST1) outputs the first output pulse (Vout1) firstly; the second stage (ST2)

outputs the second output pulse (Vout2) secondly; the third stage (ST3) outputs the third output pulse (Vout3) thirdly; . . . ; and then the 'n'th stage (STn) outputs the 'n'th output pulse (Voutn) finally. In the meantime, after the 'n'th stage (STn) outputs the 'n'th output pulse (Voutn), the dummy stage (STn+1) outputs the 'n+1'th output pulse (Voutn+1). At this time, the 'n+1'th output pulse (Voutn+1) outputted from the dummy stage (STn+1) is supplied not to the gate line but to the 'n'th stage (STn). This shift register is formed in a non-display area of an LCD panel.

All the stages (ST1 to STn+1) included in the shift register are supplied with the charging voltage source (VDD), the discharging voltage source (VSS), and the three clock pulses among the first to fourth clock pulses (CLK1 to CLK4) provided with the sequential phase differences. According to the circuit structure of the stage, the number of clock pulses supplied to one stage may be varied. At this time, the charging voltage source (VDD) is different from the discharging voltage source (VSS) in value. Generally, the charging voltage source (VDD) is larger than the discharging voltage source (VSS). Also, the charging voltage source (VDD) has the positive polarity and the discharging voltage source (VSS) has the negative polarity. The discharging voltage source (VSS) may be the ground voltage. The first stage (ST1), which is the uppermost one among the stages (ST1 to STn+1), is supplied with a start pulse (Vst) as well as the charging voltage source (VDD), the discharging voltage source (VSS), and the three clock pulses among the first to fourth clock pulses (CLK1 to CLK4).

As mentioned above, the first to fourth clock pulses (CLK1 to CLK4) are outputted with the sequential phase differences. That is, the second clock pulse (CLK2) is phase-delayed by one pulse width from the first clock pulse (CLK1); the third clock pulse (CLK3) is phase-delayed by one pulse width from the second clock pulse (CLK2); the fourth clock pulse (CLK4) is phase-delayed by one pulse width from the third clock pulse (CLK3); and the first clock pulse (CLK1) is phase-delayed by one pulse width from the fourth clock pulse (CLK4). The first to fourth clock pulses (CLK1 to CLK4) are outputted in sequence, wherein the sequential output from the first to fourth clock pulses (CLK1 to CLK4) are carried out repeatedly. That is, after completing the sequential output from the first to fourth clock pulses (CLK1 to CLK4), the first to fourth clock pulses (CLK1 to CLK4) are outputted again. Accordingly, the first clock pulse (CLK1) is outputted at the period between the fourth clock pulse (CLK4) and the second clock pulse (CLK2). At this time, the fourth clock pulse (CLK4) may be outputted in synchronization with the start pulse (Vst). If outputting the fourth clock pulse (CLK4) in synchronization with the start pulse (Vst), the fourth clock pulse (CLK4) is outputted firstly among the first to fourth clock pulses (CLK1 to CLK4).

The start pulse (Vst) is outputted in synchronization with the fourth clock pulse (CLK4). Even though the clock pulses (CLK1 to CLK4) are outputted several times during one frame, the start pulse (Vst) is outputted once during one frame. In other words, the respective clock pulses (CLK1 to CLK4) represent the active state (high state) several times during one frame, but the start pulse (Vst) represents the active state once during one frame.

The shift register according to the present invention may use the two clock pulses (two-phase clock pulse) having the different phases from each other, or may use the three clock pulses (three-phase clock pulse) having the different phases from one another. Also, the shift register according to the present invention may use the five or more clock pulses having the different phases from one another. Each of the stages (ST1 to STn+1) included in the shift register according to the present invention is supplied with the three clock pulses, wherein one corresponds to the clock pulse which is necessary for each of the stages (ST1 to STn+1) to output the output pulse; another corresponds to the clock pulse which controls a pull-down switching unit (Trpd) of each of the stages (ST1 to STn+1); and the other corresponds to the clock pulse which controls a noise eliminating unit of each of the stages (ST1 to STn+1).

To make each of the stages (ST1 to STn+1) output the output pulse, an enable node (Q) of each of the stages (ST1 to STn+1) is charged previously (that is, enable operation). For this, each of the stages (ST1 to STn+1) is supplied with the output pulse outputted from the preceding stage thereof, whereby the enable node (Q) of the corresponding stage is charged. That is, the enable node (Q) of the 'k'th stage is charged with the charging voltage source (VDD) in response to the output pulse of the 'k−1'th stage. Since there is no stage prior to the first stage (ST1) corresponding to the uppermost one among the stages, the first stage (ST1) is supplied with the start pulse (Vst) outputted from a timing controller. Thus, the enable node of the first stage (ST1) is charged with the charging voltage source (VDD). Also, the enable node (Q) of each of the stages (ST1 to STn+1) is discharged in response to the output pulse from the next stage thereof. For example, according as the discharging voltage source (VSS) is applied to the enable node (Q) of the 'k'th stage, the enable node (Q) of the 'k'th stage is discharged in response to the output pulse from the 'k+1'th stage.

The detailed explanation for each of the stages (ST1 to STn+1) included in the shift register according to the present invention will be described as follows.

Figure 4:
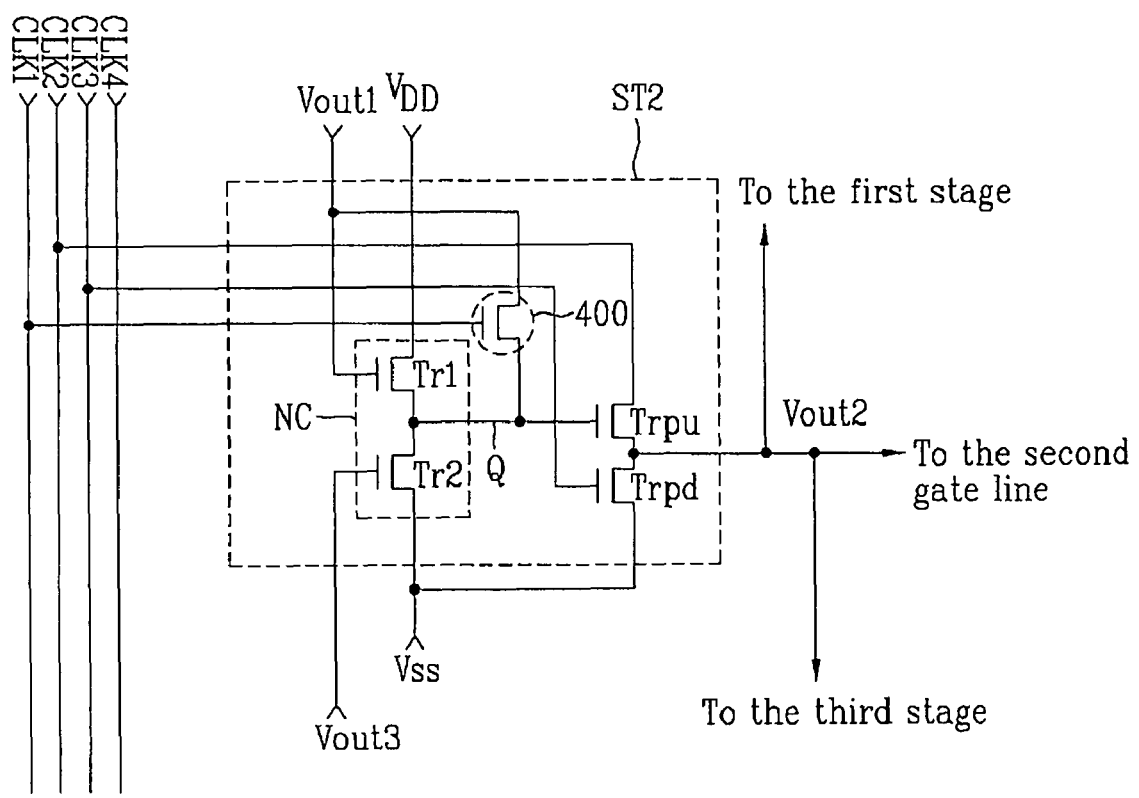
FIG. 4 illustrates one circuit structure included in a second stage of FIG. 2.

FIG. 4 illustrates one circuit structure included in the second stage of FIG. 2. As shown in FIG. 4, each of the stages (ST1 to STn+1) is comprised of an enable node (Q); a node control unit (NC) which controls the signal stage of the enable node (Q); a pull-up switching unit (Trpu) which outputs an output pulse according to the signal state of the enable node (Q); a pull-down switching unit (Trpd) which discharges an output terminal of the pull-up switching unit (Trpu) in response to the output pulse from the next stage; and a noise eliminating unit 400 which periodically discharges the enable node (Q). At this time, the node control unit (NC) comprises first and second switches (Tr1, Tr2).

The first switch (Tr1) included in the node control unit (NC) of the 'k'th stage responds to the output pulse from the 'k−1'th stage, to thereby charge the enable node (Q) of the 'k'th stage with the charging voltage source (VDD). For this, a gate terminal of the first switch (Tr1) included in the node control unit (NC) of the 'k'th stage is connected with an output terminal of the 'k−1'th stage; a drain terminal of the first switch (Tr1) is connected with a power transmission line to transmit the charging voltage source (VDD); and a source terminal of the first switch (Tr1) is connected with the enable node (Q) of the 'k'th stage. For example, the first switch (Tr1) included in the second stage (ST2) of FIG. 4 responds to the first output pulse (Vout1) from the first stage (ST1), to thereby charge the enable node (Q) of the second stage (ST2) with the charging voltage source (VDD). However, since there is no stage prior to the first stage (ST1), the first switch (Tr1) included in the first stage (ST1) responds to the start pulse (Vst) outputted from the timing controller, thereby charging the enable node (Q) of the first stage (ST1) with the charging voltage source (VDD).

The second switch (Tr2) included in the node control unit (NC) of the 'k'th stage responds to the output pulse from the 'k+1'th stage, whereby the enable node (Q) of the 'k'th stage is discharged by the discharging voltage source (VSS). For this, a gate terminal of the second switch (Tr2) included in the node control unit (NC) of the 'k'th stage is connected with an output terminal of the 'k+1'th stage; a drain terminal of the second switch (Tr2) is connected with the enable node (Q) of the 'k'th stage; and a source terminal of the second switch (Tr2) is connected with a power transmission line to transmit the discharging voltage source (VSS). For example, the second switch (Tr2) included in the second stage (ST2) of FIG. 4 responds to the third output pulse (Vout3) from the third stage (ST3), to thereby discharge the enable node (Q) of the second stage (ST2) by the discharging voltage source (VSS).

The clock pulses supplied to the shift register according to the present invention corresponds to the four-phase clock pulse. Thus, the drain terminal of the pull-up switching unit (Trpu) included in each of the stages (ST1 to STn+1) is supplied with the following clock pulses. That is, the pull-up switching unit (Trpu) included in the '4k+1'th stage is supplied with the first clock pulse (CLK1); the pull-up switching unit (Trpu) included in the '4k+2'th stage is supplied with the second clock pulse (CLK2); the pull-up switching unit (Trpu) included in the '4k+3'th stage is supplied with the third clock pulse (CLK3); and the pull-up switching unit (Trpu) included in the '4k+4'th stage is supplied with the fourth clock pulse (CLK4). For example, the pull-up switching unit (Trpu) included in the second stage (ST2) of FIG. 4 is supplied with the second clock pulse (CLK2).

As shown in FIG. 4, the noise eliminating unit 400 included in each of the stages (ST1 to STn+1) substantially corresponds to the switching element which includes a gate terminal supplied with the clock pulse, a drain terminal supplied with the output pulse, and a source terminal connected with the enable node (Q). The clock pulse is supplied to the gate terminal of the noise eliminating unit 400 included in each of the stages (ST1 to STn+1). The phase of clock pulse supplied to the gate terminal of the noise eliminating unit 400 is prior to the phase of clock pulse supplied to the drain terminal of the pull-up switching unit (Trpu). That is, the phase of clock pulse supplied to the noise eliminating unit 400 of the 'k'th stage is prior to the phase of clock pulse supplied to the pull-up switching unit (Trpu) of the 'k'th stage. Accordingly, the clock pulse supplied to the noise eliminating unit 400 of the 'k'th stage is identical to the clock pulse supplied to the drain terminal of the pull-up switching unit (Trpu) included in the 'k−1'th stage. For example, the second clock pulse (CLK2) is supplied to the pull-up switching unit (Trpu) of the second stage (ST2) of FIG. 4, and the first clock pulse (CLK1) is supplied to the noise eliminating unit 400 of the second stage (ST2). At this time, the first clock pulse (CLK1) supplied to the noise eliminating unit 400 of the second stage (ST2) is identical to the first clock pulse (CLK1) supplied to the pull-up switching unit (Trpu) of the first stage (ST1).

In the meantime, the drain terminal of the noise eliminating unit 400 included in each of the stages (ST1 to STn+1) is supplied with the output pulse from the preceding stage. That is, the 'k−1'th output pulse from the 'k−1'th stage is supplied to the drain terminal of the noise eliminating unit 400 included in the 'k'th stage. The output pulse outputted from the corresponding one of the stages (ST1 to STn+1) and the clock pulse supplied to the gate terminal of the noise eliminating unit 400 included in the next stage are maintained in the high state at the same time for a predetermined period. That is, the high state of the output pulse from the corresponding stage is partially overlapped with the high state of the output pulse from the next stage. For example, the 'k'th output pulse from the pull-up switching unit (Trpu) included in the 'k'th stage is determined based on the clock pulse supplied to the drain terminal of the pull-up switching unit (Trpu). Thus, the 'k'th output pulse and the clock pulse supplied to the gate terminal of the noise eliminating unit 400 included in the 'k+1'th stage are maintained in the high state at the same time for the predetermined period. At this time, the output pulse is maintained in the high state for a predetermined period of one frame, and is also maintained in the low state for other periods of one frame. Then, the clock pulse corresponding to the output pulse is periodically shown in the high state several times during one frame. That is, the high state of the output pulse corresponds to any one among the plural high states of the clock pulse.

The noise eliminating unit 400 is controlled by the aforementioned clock pulse, to thereby supply the output pulse to the enable node (Q) of the corresponding stage including the noise eliminating unit 400. Also, as explained above, the clock pulse supplied to the gate terminal of the noise eliminating unit 400 is provided with the high state several times during one frame, whereby the noise eliminating unit 400 is turned-on several times during one frame. At this time, during the charge period where the output pulse and the clock pulse supplied to the noise eliminating unit 400 are maintained in the high state at the same time, the turned-on noise eliminating unit 400 supplies the output pulse of the high state to the enable node (Q) of the corresponding stage. As a result, the enable node (Q) of the corresponding stage is charged.

After that, during the discharge period where the output pulse and the clock pulse have the different states, that is, during the period where the output pulse has the low state and the clock pulse has the high state, the turned-on noise eliminating unit 400 supplies the output pulse of the low state to the enable node (Q) of the corresponding stage. Accordingly, the enable node (Q) of the corresponding stage is discharged. At this time, the clock pulse is periodically provided with the high state. During the discharge period, the enable node (Q) is periodically discharged by the output pulse of the low state whenever the noise eliminating unit 400 is turned-on. Accordingly, it is possible to prevent the undesired voltage from being accumulated in the enable node (Q) by the coupling phenomenon.

Figure 5:
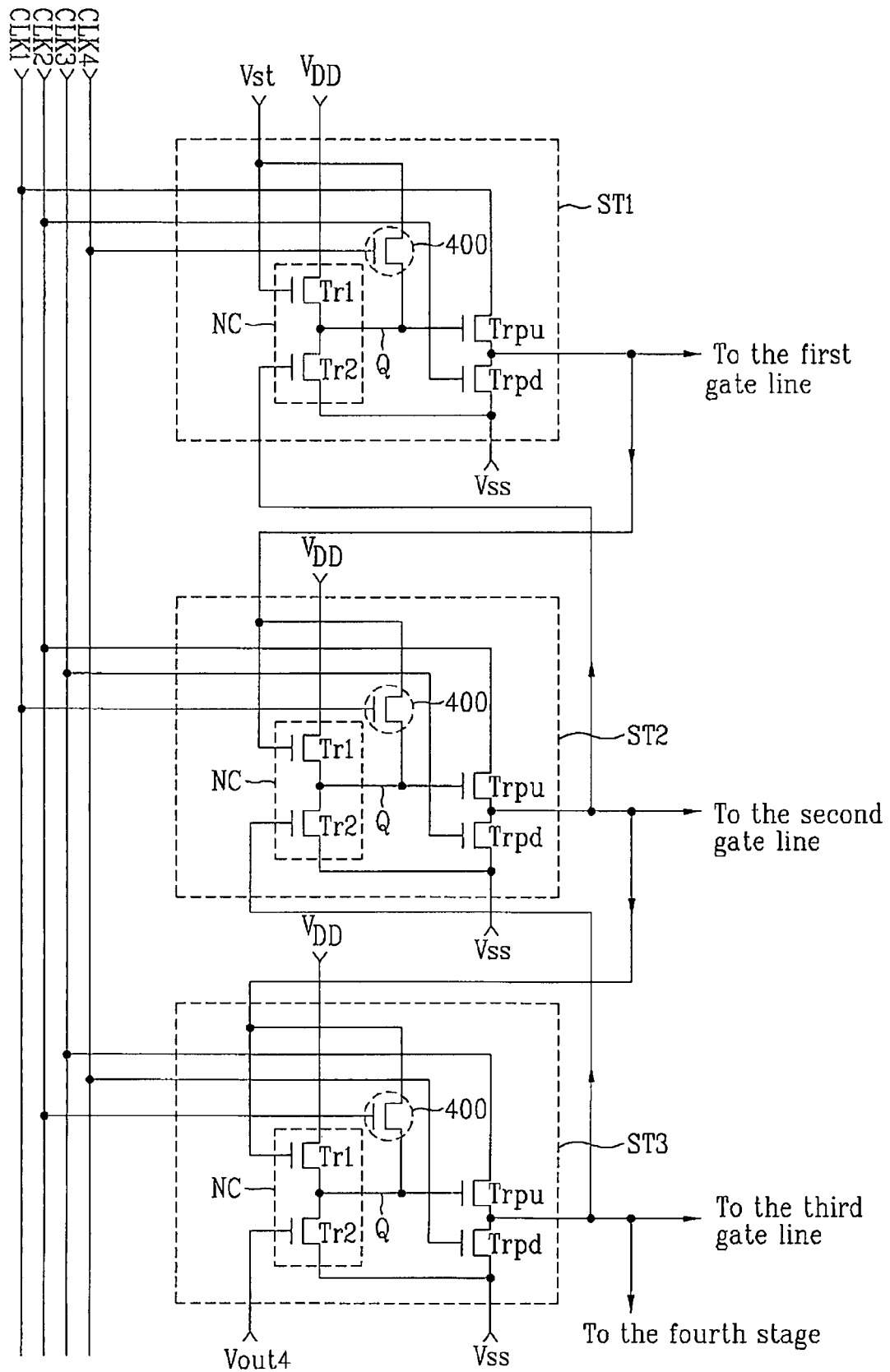
FIG. 5 illustrates first to third stages provided with the circuit structure of FIG. 4.

An operation of the shift register according to the preferred embodiment of the present invention will be explained as follows. FIG. 5 illustrates first to third stages provided with the circuit structure of FIG. 4.

During an initial period (T0), the shift register according to the preferred embodiment of the present invention will be operated as follows. During the initial period (T0), as shown in FIG. 3, the start pulse (Vst) and the fourth clock pulse (CLK4) are maintained in the high state, and the other clock pulses (CLK1, CLK2, CLK3) are maintained in the low state, wherein the start pulse (Vst) and the fourth clock pulse (CLK4) are outputted from a level shifter under control of a timing controller. The start pulse (Vst) from the timing controller is inputted to the first stage (ST1). In detail, as shown in FIG. 5, the start pulse (Vst) is inputted to the drain terminal of the noise eliminating unit 400 and the gate terminal of the first switch (Tr1) included in the first stage (ST1). Then, the first switch (Tr1) of the first stage (ST1) is turned-on, whereby the charging voltage source (VDD) is supplied to the enable node (Q) of the first stage (ST1) through the turned-on first switch (Tr1). During the initial period (T0), the fourth clock pulse (CLK4) is supplied to the gate terminal of the noise eliminating unit 400 included in the first stage (ST1). Thus, the noise eliminating unit 400 is turned-on, whereby the start pulse (Vst) is supplied to the enable node (Q) of the first stage (ST1) through the turned-on noise eliminating unit 400. Accordingly, the enable node (Q) of the first stage (ST1) is charged by the charging voltage source (VDD) and the start pulse (Vst) of the high state, thereby turning on the pull-up switching unit (Trpu) of which gate terminal is connected with the charged enable node (Q). During the initial period (T0), there are no output pulses from the second to dummy stages (ST2 to STn+1). Thus, the second switch (Tr2) and the pull-down switching unit (Trpd) included in the first stage (ST1) are turned-off.

The first period (T1) will be explained as follows. During the first period (T1), as shown in FIG. 3, the first clock pulse (CLK1) is maintained in the high state, and the start pulse (Vst) and the other clock pulses (CLK2, CLK3, CLK4) are maintained in the low state. In response to the start pulse (Vst) of the low state, the first switch (Tr1) of the first stage (ST1) is turned-off. Also, the noise eliminating unit 400 of the first stage (ST1) is turned-off in response to the fourth clock pulse (CLK4) of the low state. According as the first switch (Tr1) and the noise eliminating unit 400 are turned-off, the enable node (Q) of the first stage (ST1) is maintained in the floating state. As the enable node (Q) of the first stage (ST1) is maintained in the charge state by the charging voltage source (VDD) applied to the initial period (T0), the pull-up switching unit (Trpu) of which gate terminal is connected with the enable node (Q) is maintained in the turn-on state. At this time, the first clock pulse (CLK1) is supplied to the drain terminal of the turned-on pull-up switching unit (Trpu). As shown in FIG. 3, the charging voltage source (VDD) charged in the enable node (Q) of the first stage (ST1) is amplified (bootstrapping) This amplification of the charging voltage source (VDD) occurs because the enable node (Q) is in the floating state. Accordingly, the first clock pulse (CLK1) supplied to the drain terminal of the pull-up switching unit (Trpu) included in the first stage (ST1) is stably outputted through the source terminal of the pull-up switching unit (Trpu). The first clock pulse (CLK1) from the pull-up switching unit (Trpu) corresponds to the first output pulse (Vout1).

The first output pulse (Vout1) is supplied to the first gate line, wherein the first output pulse (Vout1) functions as the scan pulse to drive the first gate line. Also, the first output pulse (Vout1) is supplied to the second stage (ST2), wherein the first output pulse (Vout1) functions as the start pulse (Vst) to charge the enable node (Q) of the second stage (ST2). That is, the first output pulse (Vout1) outputted from the first stage (ST1) at the first period (T1) is supplied to the gate terminal of the first switch (Tr1) included in the second stage (ST2) and the drain terminal of the noise eliminating unit 400 included in the second stage (ST2). Thus, the first switch (Tr1) of the second stage (ST2) is turned-on. Also, the first clock pulse (CLK1) of the high state is supplied to the gate terminal of the noise eliminating unit 400 of the second stage (ST2), whereby the noise eliminating unit 400 of the second stage (ST2) is turned-on. During the first period (T1), the first switch (Tr1) and the noise eliminating unit 400 included in the second stage (ST2) are turned-on together. Through the first switch (Tr1) being turned-on, the charging voltage source (VDD) is supplied to the enable node (Q) of the second stage (ST2). Through the noise eliminating unit 400 being turned-on, the first output pulse (Vout1) is supplied to the enable node (Q) of the second stage (ST2). Accordingly, the enable node (Q) of the second stage (ST2) is charged by the charging voltage source (VDD) and the first output pulse (Vout1) of the high state, and the pull-up switching unit (Trpu) of which gate terminal is connected with the charged enable node (Q) is turned-on. During the first period (T1), since there are no output pulses outputted from the third to dummy stages (STn+1), the pull-down switching unit (Trpd) and the second switch (Tr2) included in the second stage (ST2) are turned-off.

The second period (T2) will be explained as follows. During the second period (T2), as shown in FIG. 3, only the second clock pulse (CLK2) is maintained in the high state, and the start pulse (Vst) and the other clock pulses (CLK1, CLK3, CLK4) are maintained in the low state. In response to the first output pulse (Vout1) of the low state, the first switch (Tr1) of the second stage (ST2) is turned-off. Also, the noise eliminating unit 400 of the second stage (ST2) is turned-off in response to the first clock pulse (CLK1) of the low state. According as the first switch (Tr1) and the noise eliminating unit 400 are turned-off, the enable node (Q) of the second stage (ST2) is maintained in the floating state. As the enable node (Q) of the second stage (ST2) is continuously maintained in the charge state by the charging voltage source (VDD) applied at the first period (T1), the pull-up switching unit (Trpu) of which gate terminal is connected with the enable node (Q) is maintained in the turn-on state.

At this time, the second clock pulse (CLK2) is applied to the drain terminal of the turned-on pull-up switching unit (Trpu). As shown in FIG. 3, the voltage source charged in the enable node (Q) of the second stage (ST2) is amplified (bootstrapping). Accordingly, the second clock pulse (CLK2) supplied to the drain terminal of the pull-up switching unit (Trpu) included in the second stage (ST2) is stably outputted through the source terminal of the pull-up switching unit (Trpu). The second clock pulse (CLK2) outputted from the pull-up switching unit (Trpu) corresponds to the second output pulse (Vout2). The second output pulse (Vout2) is supplied to the second gate line, wherein the second output pulse (Vout2) functions as the scan pulse to drive the second gate line. Also, the second output pulse (Vout2) is supplied to the third stage (ST3), wherein the second output pulse (Vout2) functions as the start pulse (Vst) to charge the enable node (Q) of the third stage (ST3). That is, the second output pulse (Vout2) outputted from the second stage (ST2) at the second period (T2) is supplied to the gate terminal of the first switch (Tr1) included in the third stage (ST3) and the drain terminal of the noise eliminating unit 400 included in the third stage (ST3). In the aforementioned method, the enable node (Q) of the third stage (ST3) is charged. That is, the third stage (ST3) is enabled.

The second output pulse (Vout2) outputted from the second stage (ST2) at the second period (T2) is supplied to the first stage (ST1), to thereby discharge the enable node (Q) of the first stage (ST1). That is, the first stage (ST1) is disabled in response to the second output pulse (Vout2) from the second stage (ST2). This will be explained in detail. That is, the second output pulse (Vout2) from the second stage (ST2) at the second period (T2) is supplied to the gate terminal of the second switch (Tr2) included in the first stage (ST1). Thus, the second switch (Tr2) is turned-on, and the discharging voltage source (VSS) is supplied to the enable node (Q) of the first stage (ST1) through the second switch (Tr2) being turned-on, thereby turning off the pull-up switching unit (Trpu) connected with the enable node (Q) of the discharged first stage (ST1). Also, the pull-down switching unit (Trpd) of the first stage (ST1) supplied with the second clock pulse (CLK2) at the second period (T2) is turned-on. Through the pull-down switching unit (Trpd) being turned-on, the discharging voltage source (VSS) is supplied to the first gate line, so that the first gate line is discharged. During the second period (T2), the second stage (ST2) outputs the second output pulse (Vout2). The second output pulse (Vout2) drives the second gate line, enables the third stage (ST3), and disables the first stage (ST1). In this method, the third stage (ST3) outputs the third output pulse (Vout3) at the third period (T3), and the fourth stage (ST4) outputs the fourth output pulse (Vout4) at the fourth period (T4).

In the meantime, the fourth clock pulse (CLK4) outputted at the fourth period (T4) is supplied to the first stage (ST1). That is, the fourth clock pulse (CLK4) is supplied to the gate terminal of the noise eliminating unit 400 included in the first stage (ST1).

The noise eliminating unit 400 is turned-on by the fourth clock pulse (CLK4). Through the noise eliminating unit 400 being turned-on, the start pulse (Vst) is supplied to the enable node (Q) of the first stage (ST1). The start pulse (Vst) is maintained in the low state during the other periods except the initial period (T0). That is, as shown in FIG. 3, the start pulse (Vst) is in the low state during the fourth period (T4). Accordingly, the enable node (Q) of the first stage (ST1) at the fourth period (T4) is discharged by the start pulse (Vst) of the low state.

The fourth clock pulse (CLK4) is maintained in the high state every period of '4p+4' ('p' is an integer including '0') including the initial period (T0). Thus, the noise eliminating unit 400 of the first stage (ST1) supplied with the fourth clock pulse (CLK4) is turned-on every period of '4p+4'. At this time, the noise eliminating unit 40 being turned-on selectively outputs any one of the high-state start pulse (Vst) and the low-state start pulse (Vst). That is, the initial period (T0) corresponds to the point (charge period) in which the enable node (Q) of the first stage (ST1) is charged. During the initial period (T0), both the start pulse (Vst) and the fourth clock pulse (CLK4) are maintained in the high state. Accordingly, the noise eliminating unit 400 charges the enable node (Q) of the first stage (ST1) with the start pulse (Vst) of the high state during the initial period (T0). After the initial period (T1), the periods of '4p+4' (T4, T8, . . . ) correspond to the point in which the enable node (Q) of the first stage (ST1) is discharged. During the periods of '4p+4', the start pulse (Vst) is maintained in the low state, and the fourth clock pulse (CLK4) is maintained in the high state. Accordingly, the noise eliminating unit 400 discharges the enable node (Q) of the first stage (ST1) by the start pulse (Vst) of the low state during the periods of '4p+4'.

In this method, the noise eliminating unit 400 included in each of the other stages charges and discharges the enable node (Q) of the corresponding stage. That is, the noise eliminating unit 400 included in the second stage (ST2) charges the enable node (Q) of the second stage (ST2) with the first output pulse (Vout1) of the high state during the charge period by the first clock pulse (CLK1) and the first output pulse (Vout1) from the first stage (ST1); and discharges the enable node (Q) of the second stage (ST2) during the discharge period by the first output pulse (Vout1) of the low state. Through the noise eliminating unit 400, each of the stages (ST1 to STn+1) periodically discharges the enable node (Q), to thereby prevent the undesired voltage from being accumulated in the enable node (Q).

Figure 6:
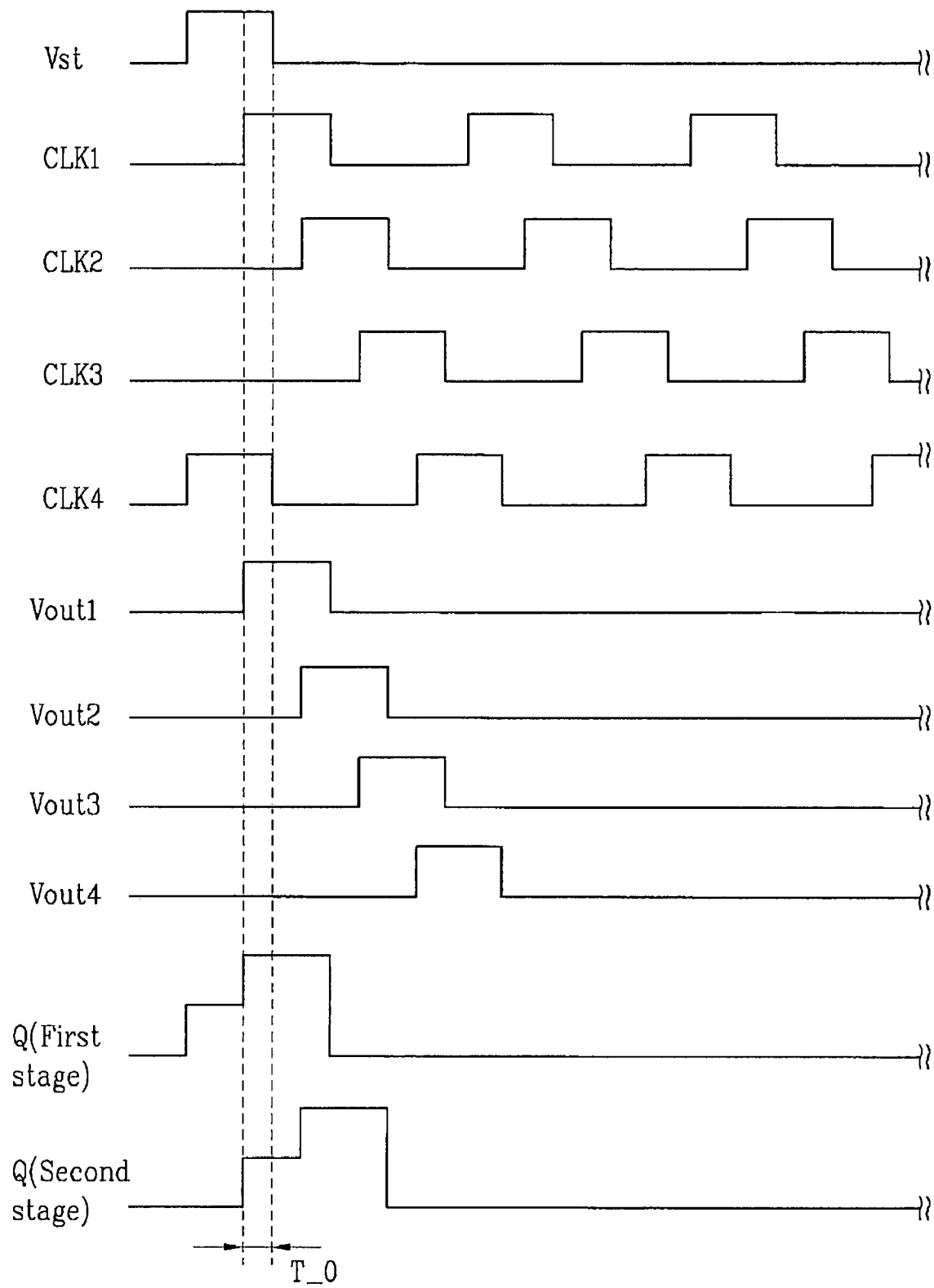
FIG. 6 illustrates a timing view of other signals supplied to and outputted from the shift register of FIG. 2.

The start pulse (Vst) and the clock pulses (CLK1 to CLK4) have the following properties. FIG. 6 illustrates a timing view of other signals supplied to and outputted from the shift register of FIG. 4.

The first to fourth clock pulses (CLK1 to CLK4) are outputted with the sequential phase differences. That is, the second clock pulse (CLK2) is outputted by the phase delay corresponding to ⅓ of one pulse width as compared to the first clock pulse (CLK1). The third clock pulse (CLK3) is outputted by the phase delay corresponding to ⅓ of one pulse width as compared to the second clock pulse (CLK2). The fourth clock pulse (CLK4) is outputted by the phase delay corresponding to ⅓ of one pulse width as compared to the third clock pulse (CLK1). The first clock pulse (CLK1) is outputted by the phase delay corresponding to ⅓ of one pulse width as compared to the fourth clock pulse (CLK4).

The start pulse (Vst) is outputted in synchronization with the fourth clock pulse (CLK4). The clock pulses (CLK1 to CLK4) are outputted several times during one frame. However, the start pulse (Vst) is outputted once during one frame. The clock pulses (CLK1 to CLK4) have the same pulse width and duty ratio. Also, the clock pulses outputted in the adjoining periods have the overlapped high state of the predetermined time together. For example, the pulse width (pulse width of high state) of the first clock pulse (CLK1) is identical to the pulse width (pulse width of high state) of the second clock pulse (CLK2), and the latter half of the first clock pulse (CLK1) is overlapped with the first half of the second clock pulse (CLK2). At this time, the overlapped portion between the pulse width of the first clock pulse (CLK1) and the pulse width of the second clock pulse (CLK2) corresponds to about ⅓ of one pulse width. Also, the latter half of the start pulse (Vst) is overlapped with the first half of the first clock pulse (CLK1).

As explained above, the noise eliminating unit 400 of the first stage (ST1) is turned-on whenever the fourth clock pulse (CLK4) is in the high state, so that the enable node (Q) of the first stage (ST1) is discharged. The fourth clock pulse (CLK4) is overlapped with the first clock pulse (CLK1) by the predetermined portion. From the overlapped point (T_0) between the first clock pulse (CLK1) and the fourth clock pulse (CLK4), the enable node (Q) of the first stage (ST1) is starting to be discharged by the start pulse (Vst) of the low state.

If the clock pulses are not overlapped, the fourth clock pulse (CLK4) is supplied to the noise eliminating unit 400 of the first stage (ST1) after completing the supply of the first clock pulse (CLK1) to the pull-up switching unit (Trpu) of the first stage (ST1). Accordingly, the undesired voltage caused by the coupling phenomenon is supplied to the enable node (Q) of the first stage (ST1) for the sufficient period of time. However, if the clock pulses (CLK1 to CLK4) are overlapped, the fourth clock pulse (CLK4) is supplied to the noise eliminating unit 400 of the first stage (ST1) before completing the supply of the first clock pulse (CLK1) to the pull-up switching unit (Trpu) of the first stage (ST1), that is, before the first clock pulse (CLK1) is completely changed to the low state from the high state. Accordingly, the undesired voltage caused by the coupling phenomenon is discharged rapidly.

Figure 20:
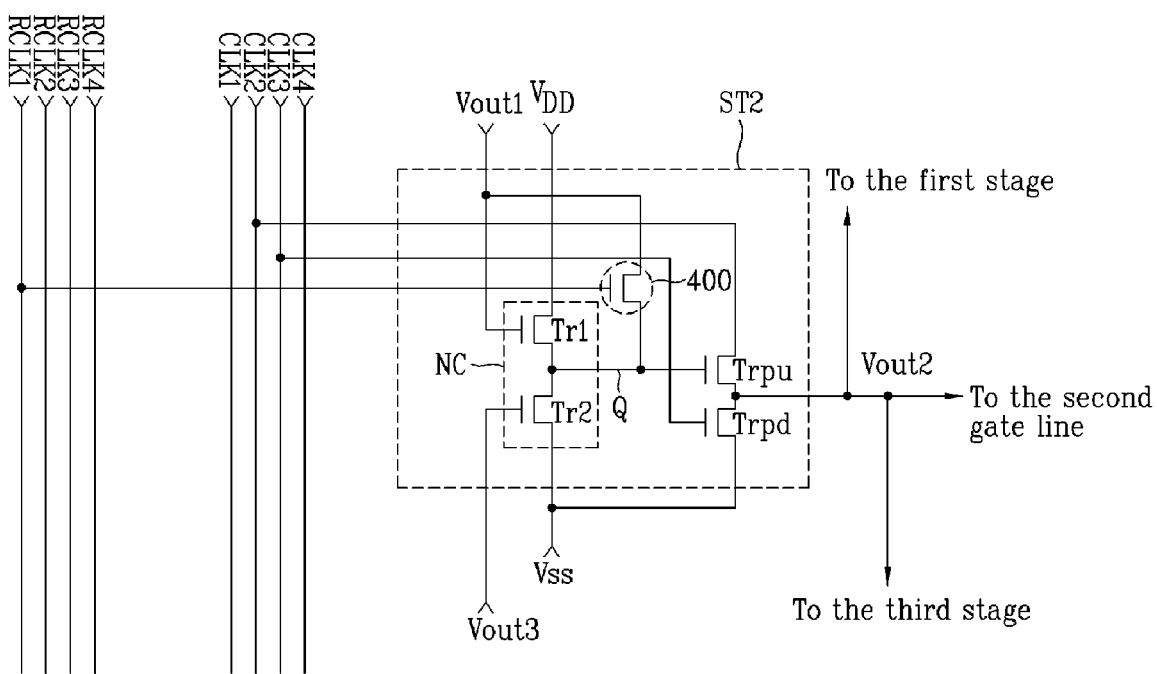
FIG. 20 illustrates other circuit structure included in a second stage of FIG. 2.
Figure 21:
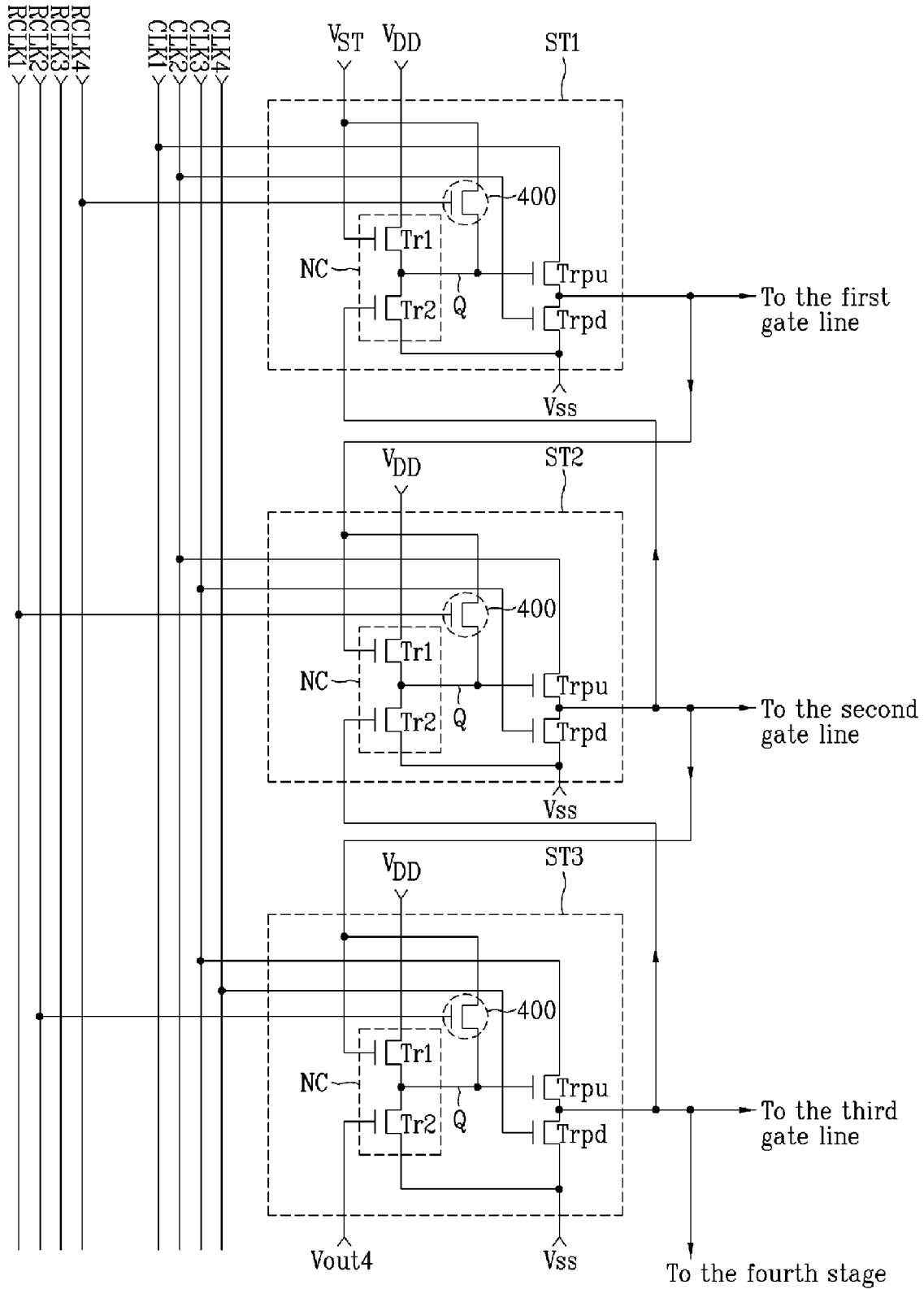
FIG. 21 illustrates first to third stages provided with the circuit structure of FIG. 20.

If the clock pulses (CLK1 to CLK4) and the start pulse (Vst) are overlapped and outputted, the clock pulse supplied to the gate terminal of the pull-down switching unit (Trpd) included in the 'k'th stage is identical to the clock pulse supplied to the drain terminal of the pull-up switching unit (Trpu) included in the 'k+2'th stage. For example, the third clock pulse (CLK3) is supplied to the gate terminal of the pull-down switching unit (Trpd) included in the first stage (ST1). The third clock pulse (CLK3) is supplied to the drain terminal of the pull-up switching unit (Trpu) of the third stage (ST3). Also, if the clock pulses (CLK1 to CLK4) and the start pulse (Vst) are overlapped and outputted, the shift register supplied with the clock pulses (CLK1 to CLK4) and the start pulse (Vst) has two dummy stages (STn+1). One is the dummy stage (STn+1) to disable the 'n'th stage (STn), and the other is the dummy stage (STn+1) to disable the 'n−1'th stage. To the noise eliminating unit 400 provided in each of the stages (ST1 to STn+1), other clock pulses which are different from the aforementioned clock pulses may be supplied as shown in FIGS. 20 and 21.

If the clock pulses (CLK1 to CLK4) and the start pulse (Vst) are overlapped and outputted, the clock pulse supplied to the gate terminal of the pull-down switching unit (Trpd) included in the 'k'th stage is identical to the clock pulse supplied to the drain terminal of the pull-up switching unit (Trpu) included in the 'k+2'th stage. For example, the third clock pulse (CLK3) is supplied to the gate terminal of the pull-down switching unit (Trpd) included in the first stage (ST1). The third clock pulse (CLK3) is supplied to the drain terminal of the pull-up switching unit (Trpu) of the third stage (ST3). Also, if the clock pulses (CLK1 to CLK4) and the start pulse (Vst) are overlapped and outputted, the shift register supplied with the clock pulses (CLK1 to CLK4) and the start pulse (Vst) has two dummy stages (STn+1). One is the dummy stage (STn+1) to disable the 'n'th stage (STn), and the other is the dummy stage (STn+1) to disable the 'n−1'th stage. To the noise eliminating unit 400 provided in each of the stages (ST1 to STn+1), other clock pulses which are different from the aforementioned clock pulses may be supplied.

Figure 7:
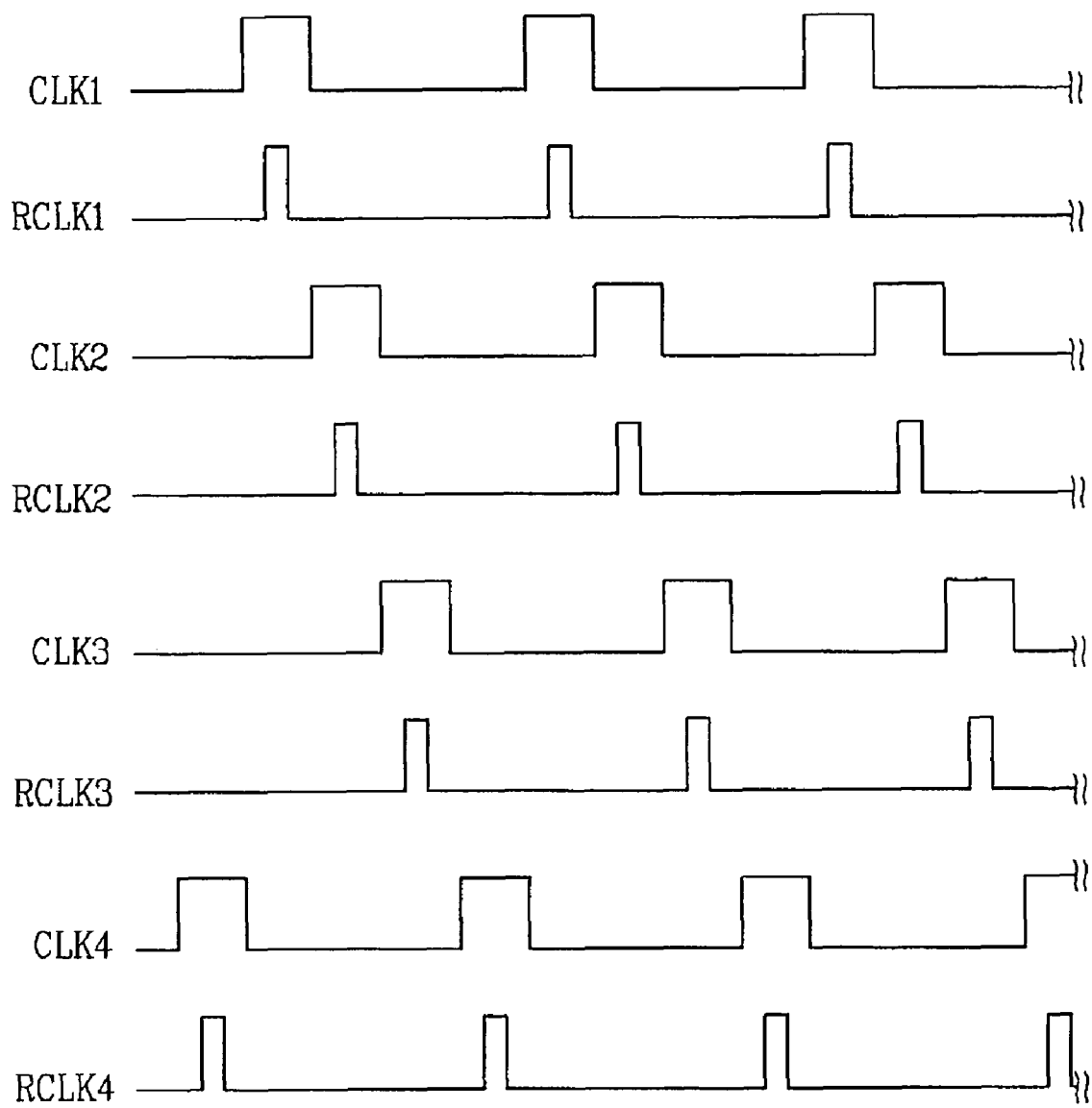
FIG. 7 illustrates a timing view of reset clock pulses.

FIG. 7 illustrates a timing view of reset clock pulses. As shown in FIG. 7, the reset clock pulses are supplied to the noise eliminating unit 400, which correspond to the four-phase clock pulse. The pulse width of the first to fourth reset clock pulses (RCLK1 to RCLK4) is different from the pulse width of the first to fourth clock pulses (CLK1 to CLK4). That is, the pulse width of the first to fourth reset clock pulses (RCLK1 to RCLK4) is smaller than the pulse width of the first to fourth clock pulses (CLK1 to CLK4). By decreasing the pulse width of the clock pulse supplied to the gate terminal of the noise eliminating unit 400, it is possible to prevent the noise eliminating unit 400 from being deteriorated. At this time, the first reset clock pulse (RCLK1) is supplied to the noise eliminating unit 400 of the '4k+2'th stage; the second reset clock pulse (RCLK2) is supplied to the noise eliminating unit 400 of the '4k+3'th stage; the third reset clock pulse (RCLK3) is supplied to the noise eliminating unit 400 of the '4k+4'th stage; and the fourth reset clock pulse (RCLK4) is supplied to the noise eliminating unit 400 of the '4k+1'th stage.

Figure 8:
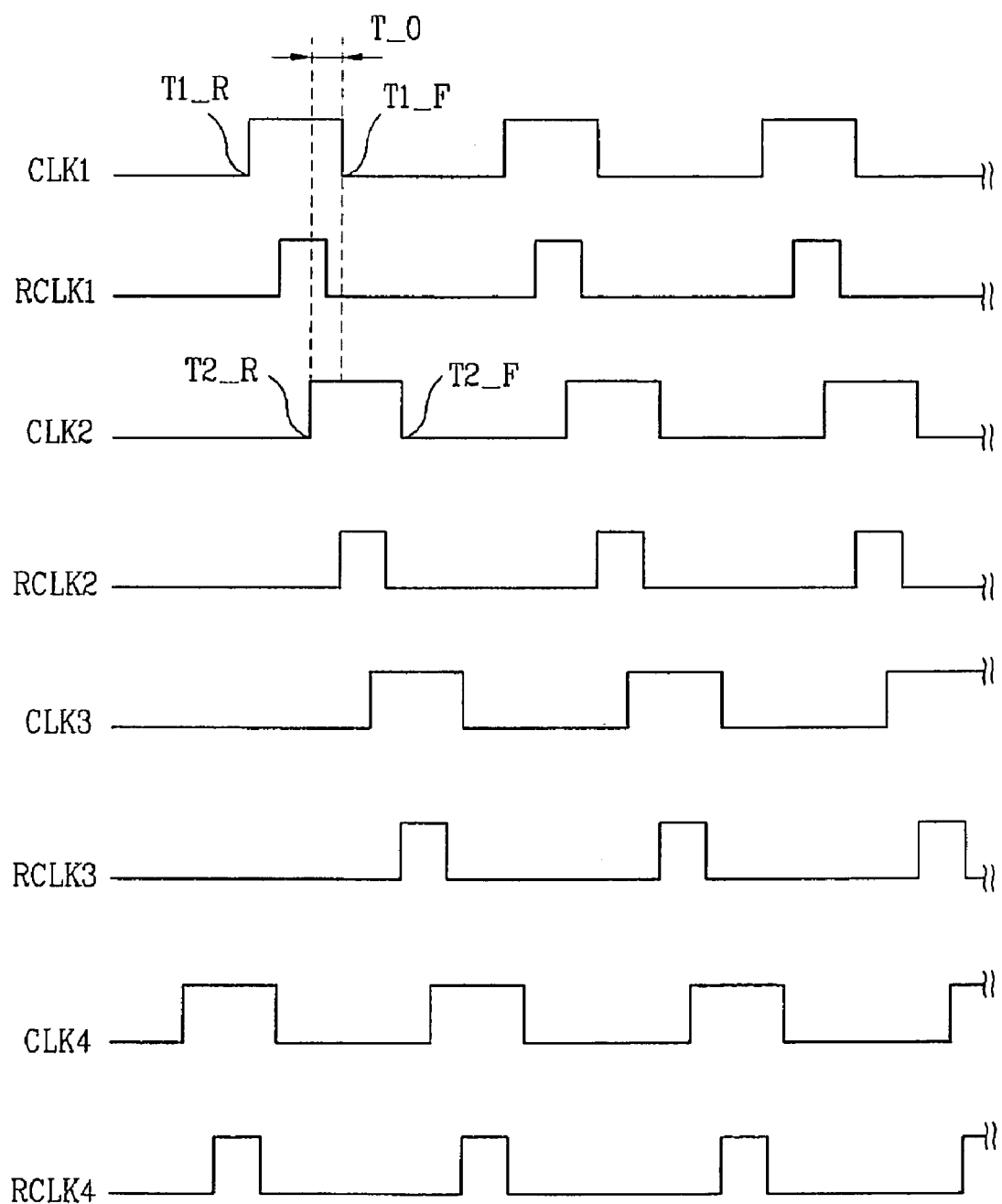
FIG. 8 illustrates a timing view of other reset clock pulses.

FIG. 8 illustrates a timing view of other reset clock pulses. The clock pulses (CLK1 to CLK4) of FIG. 8 are partially overlapped with one another, as shown in FIG. 6. If the clock pulses (CLK1 to CLK4) are overlapped with one another, reset clock pulses are also overlapped with one another. That is, the clock pulses outputted in the adjoining periods have the overlapped high state of the predetermined time together. At this time, each of the reset clock pulses (RCLK1 to RCLK4) is maintained in the high state at the period between the rising point to the high state of the firstly outputted clock pulse and the rising point to the high state of the secondly outputted clock pulse; and is changed to the low state within the predetermined time of the overlapped portion of the high state. For example, the first reset clock pulse (RCLK1) is changed from the low state to the high state in the period between the point (T1_R) at which the first clock pulse (CLK1) is changed from the low state to the high state and the point (T2_R) at which the second clock pulse (CLK2) is changed from the low state to the high state. Also, the first reset clock pulse (RCLK1) is changed from the high state to the low state in the period between the point (T2_R) at which the second clock pulse (CLK2) is changed from the low state to the high state and the point (T1_F) at which the first clock pulse (CLK1) is changed form the high state to the low state. In the overlapped period (T_0) between the first clock pulse (CLK1) and the second clock pulse (CLK2), the first reset clock pulse (RCLK1) is changed from the high state to the low state. In the meantime, the reset clock pulses outputted in the adjoining periods may be overlapped by the predetermined portion, or not.

Figure 9:
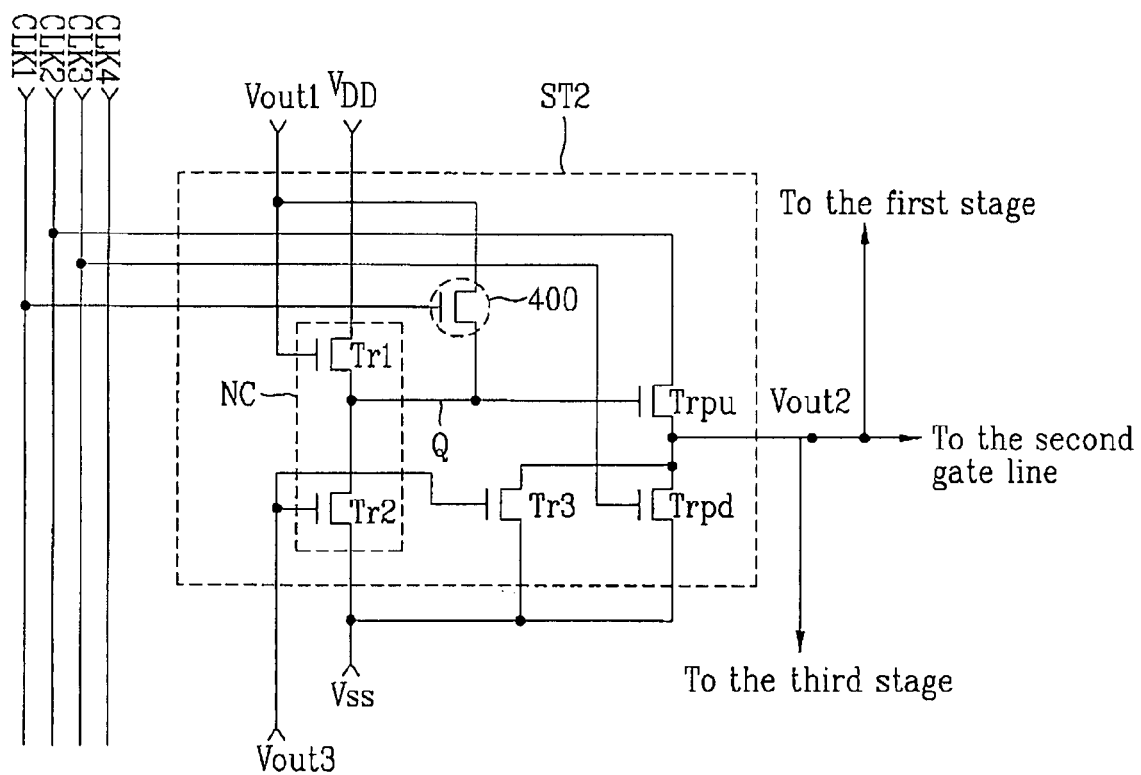
FIG. 9 illustrates another circuit structure provided in a second stage of FIG. 2.

FIG. 9 illustrates another circuit structure provided in a second stage of FIG. 2. The circuit structure of FIG. 9 is identical to that of FIG. 4 except that the circuit structure of FIG. 9 further comprises a third switch (Tr3). That is, in response to the 'k+1'th output pulse from the 'k+1'th stage, the third switch (Tr3) included in the 'k'th stage discharges the output terminal (source terminal) of the pull-up switching unit (Trpu) included in the 'k'th stage by the discharging voltage source (VSS). For this, the gate terminal of the third switch (Tr3) included in the 'k'th stage is connected with the output terminal of the 'k+1'th stage; the drain terminal of the third switch (Tr3) is connected with the source terminal of the pull-up switching unit (Trpu) included in the 'k'th stage; and the source terminal of the third switch (Tr3) is connected with the power transmission line to transmit the discharging voltage source (VSS). For example, the third switch (Tr3) included in the second stage (ST2) of FIG. 9 responds to the third output pulse (Vout3) from the third stage (ST3), whereby the source terminal of the pull-up switching unit (Trpu) included in the second stage (ST2) is discharged by the discharging voltage source (VSS). In the meantime, if the clock pulses (CLK1 to CLK4) and the start pulse (Vst) are overlapped and outputted, the gate terminal of the third switch (Tr3) included in the 'k'th stage is supplied with the 'k+2'th output pulse from the 'k+2'th stage instead of the 'k+1'th output pulse from the 'k+1'th stage.

Figure 10:
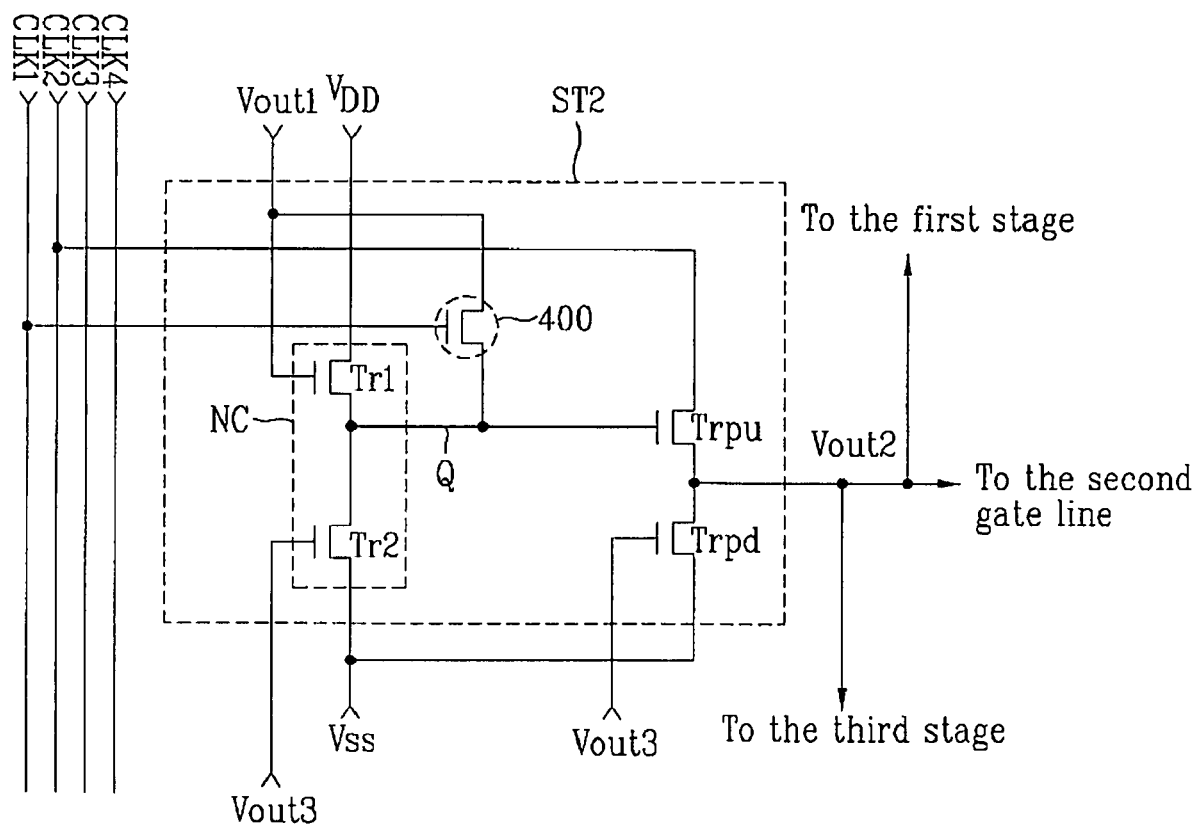
FIG. 10 illustrates a third circuit structure provided in a second stage of FIG. 2.

FIG. 10 illustrates a third circuit structure provided in a second stage of FIG. 2. The circuit structure of FIG. 10 is identical to that of FIG. 4 except that the different controlling method for the pull-down switching unit (Trpd). That is, the pull-down switching unit (Trpd) included in the 'k'th stage outputs the discharging voltage source (VSS) in response to the 'k+1'th output pulse from the 'k+1'th stage, and supplies the discharging voltage source (VSS) to the 'k'th gate line, whereby the 'k'th gate line is discharged. For this, the gate terminal of the pull-down switching unit (Trpd) included in the 'k'th stage is connected with the output terminal of the 'k+1'th stage; the drain terminal of the pull-down switching unit (Trpd) is connected with the 'k'th gate line; and the source terminal of the pull-down switching unit (Trpd) is connected with the power transmission line to transmit the discharging voltage source (VSS). For example, the pull-down switching unit (Trpd) included in the second stage (ST2) of FIG. 10 responds to the third output pulse (Vout3) from the third stage (ST3), to thereby discharge the second gate line by the discharging voltage source (VSS). In the meantime, if the clock pulses (CLK1 to CLK4) and the start pulse (Vst) are overlapped and outputted, the gate terminal of the pull-down switching unit (Trpd) included in the 'k'th stage is supplied with the 'k+2'th output pulse from the 'k+2'th stage instead of the 'k+1'th output pulse from the 'k+1'th stage.

Figure 11:
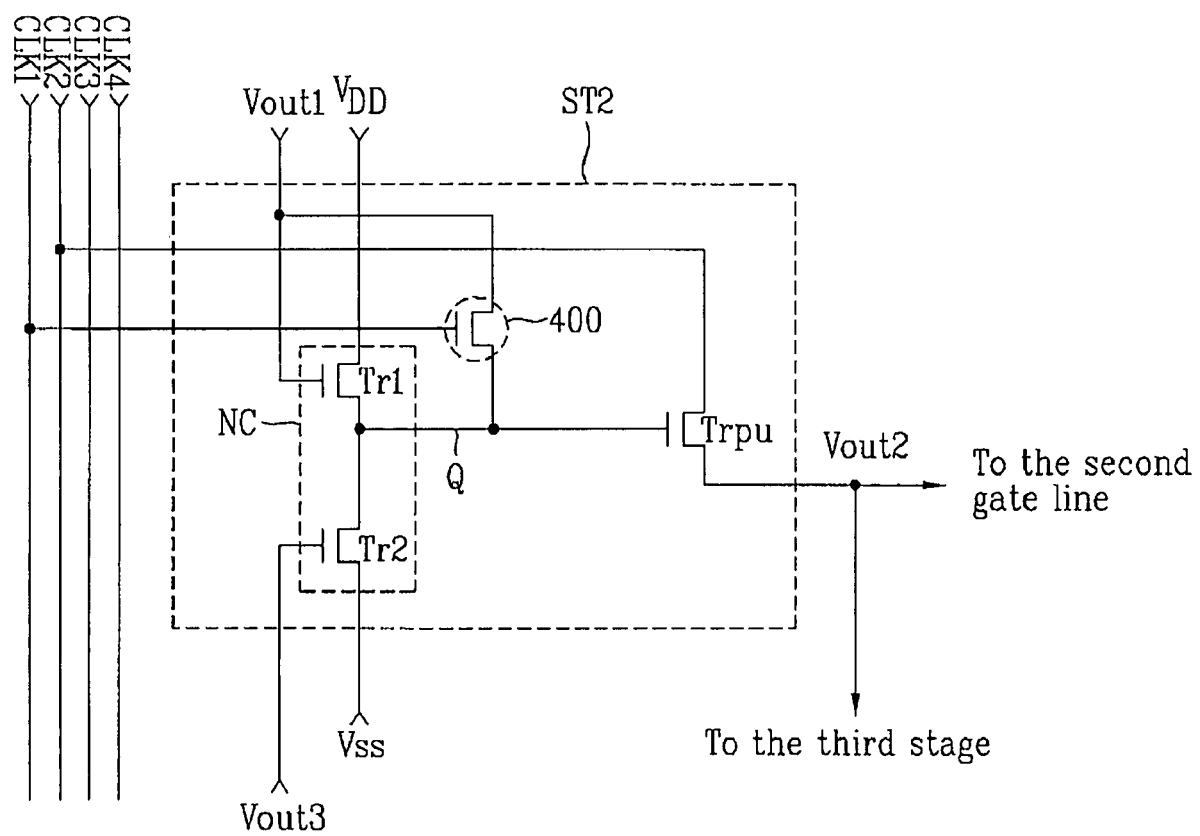
FIG. 11 illustrates a fourth circuit structure provided in a second stage of FIG. 2.

FIG. 11 illustrates a fourth circuit structure provided in a second stage of FIG. 2. The circuit structure of FIG. 11 is identical to that of FIG. 4 except that the circuit structure of FIG. 11 has no pull-down switching unit (Trpd). If not providing the pull-down switching unit (Trpd), the corresponding gate line is discharged by the clock pulse of the low state supplied through the drain terminal of the pull-up switching unit (Trpu). By removing the pull-down switching unit (Trpd), it is possible to simplify the circuit structure of each stage (ST1 to STn+1).

Figure 12:
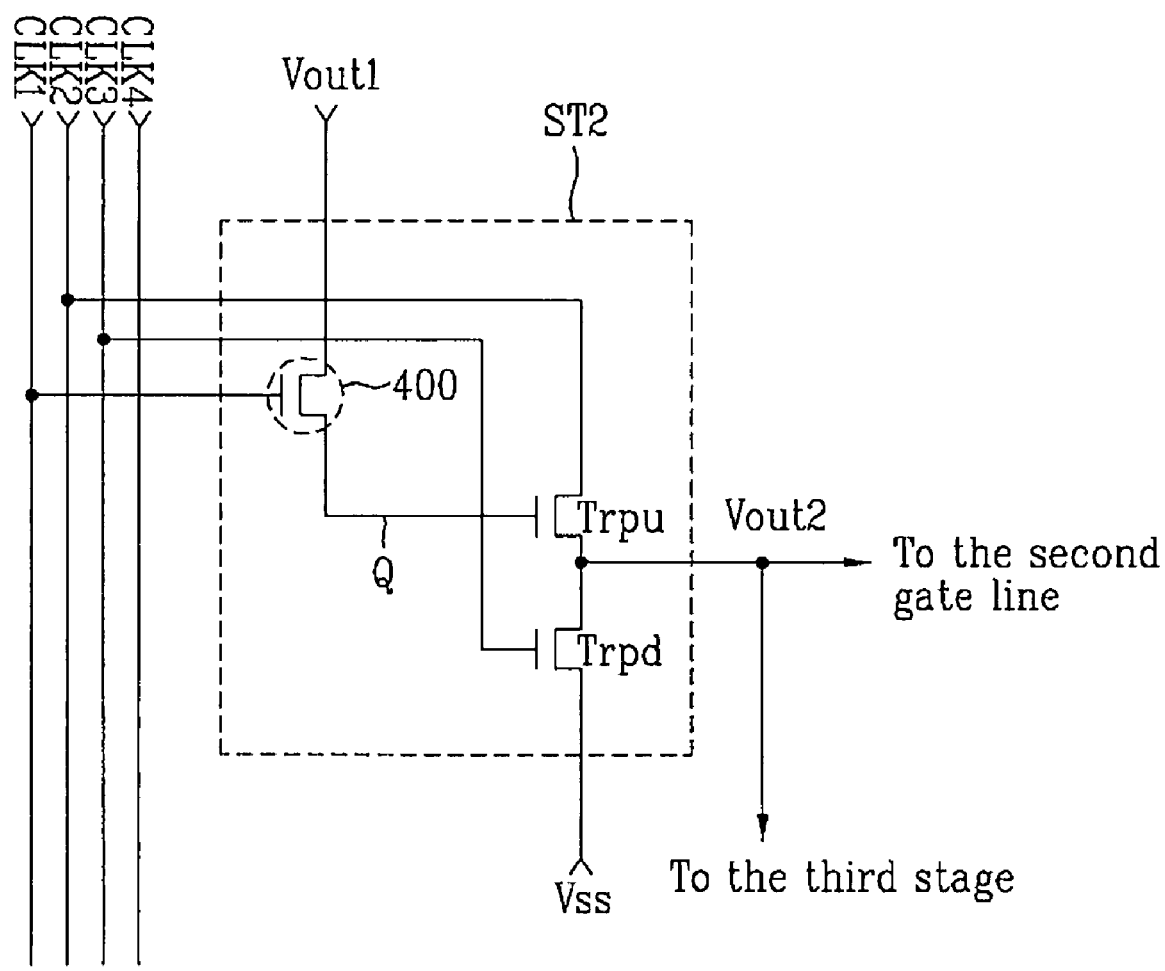
FIG. 12 illustrates a fifth circuit structure provided in a second stage of FIG. 2.

FIG. 12 illustrates a fifth circuit structure provided in a second stage of FIG. 2. The circuit structure of FIG. 12 is identical to that of FIG. 4 except that the circuit structure of FIG. 12 has no first and second switches (Tr1, Tr2). The noise eliminating unit 400 of FIG. 12 periodically discharges the enable node (Q), and also charges the enable node (Q). That is, the noise eliminating unit 400 acts as a substitute for the first switch (Tr1). The noise eliminating unit 400 included in the 'k'th stage is turned-on when the 'k–1'th output pulse from the 'k–1'th stage and the clock pulse supplied thereto are in the high state together, whereby the enable node (Q) is charged with the 'k–1'th output pulse of the high state. When the 'k–1'th output pulse in the low state and the clock pulse is in the high state, the enable node (Q) is periodically discharged by the 'k–1'th output pulse of the low state.

The shift register having the aforementioned circuit structure may be supplied with the start pulse (Vst) and the clock pulses (CLK1 to CLK4) shown in FIGS. 3, 6, 7 and 8. If each stage (ST1 to STn) has the circuit structure shown in FIG. 12, the shift register according to the preferred embodiment of the present invention doesn't require the dummy stage (STn+1). That is, the output pulse (Vout1 to Voutn) outputted from each stage (ST1 to STn) is supplied not to the preceding stage but to the next stage.

Figure 13:
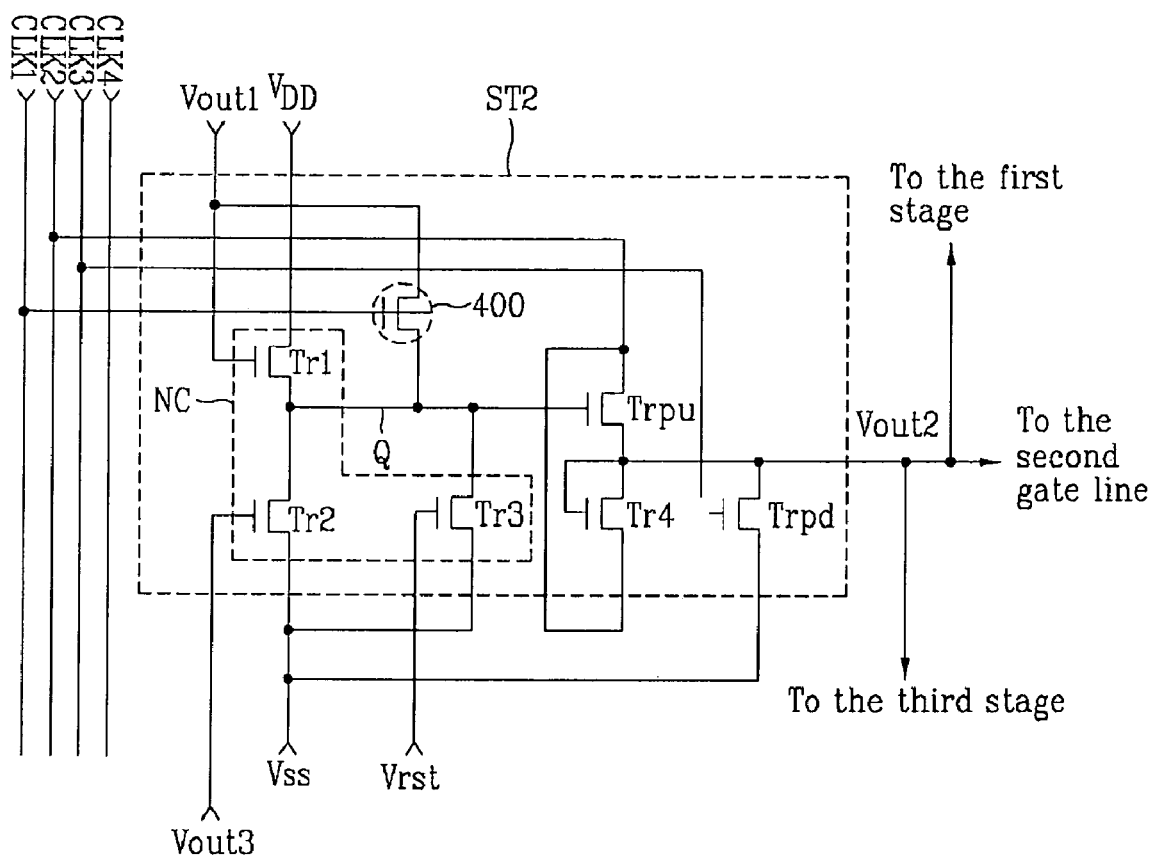
FIG. 13 illustrates a sixth circuit structure provided in a second stage of FIG. 2.

FIG. 13 illustrates a sixth circuit structure provided in a second stage of FIG. 2. As shown in FIG. 13, each stage is comprised of first to fourth switches (Tr1 to Tr4), a pull-up switching unit (Trpu), and a noise eliminating unit 400. At this time, the first and second switches (Tr1, Tr2) and the noise eliminating unit 400 are identical in structure to those of FIG. 4, whereby the detailed explanation for the first and second switches and the noise eliminating unit 400 will be omitted, and the third and fourth switches (Tr3, Tr4) will be explained as follows.

The third switch (Tr3) included in the 'k'th stage responds to a reset signal (Vrst) provided from the external, whereby the enable node (Q) of the 'k'th stage is discharged by the discharging voltage source (VSS). For this, a gate terminal of the third switch (Tr3) included in the 'k'th stage is connected with a transmission line to transmit the reset signal (Vrst); a drain terminal is connected with the enable node (Q) of the 'k'th stage; and a source terminal is connected with a power transmission line to transmit the discharging voltage source (VSS). At this time, the reset signal (Vrst) is supplied to the third switch (Tr3) of each of the stages in a blank period between the adjoining frames. In the blank period, the enable node (Q) of the stage is discharged by the discharging voltage source (VSS).

The fourth switch (Tr4) included in the 'k'th stage responds to the output from the pull-up switching unit (Trpu), whereby drain and source terminals of the pull-up switching unit (Trpu) are connected with each other. For this, gate and drain terminals of the fourth switch (Tr4) included in the 'k'th stage are connected with the source terminal of the pull-up switching unit (Trpu), and a source terminal of the fourth switch (Tr4) is connected with the drain terminal of the pull-up switching unit (Trpu). The fourth switch (Trpu) functions as the aforementioned pull-down switching unit, wherein the fourth switch (Tr4) is less degraded than the pull-down switching unit (Trpd) owing to the aforementioned connection structure.

Figure 14:
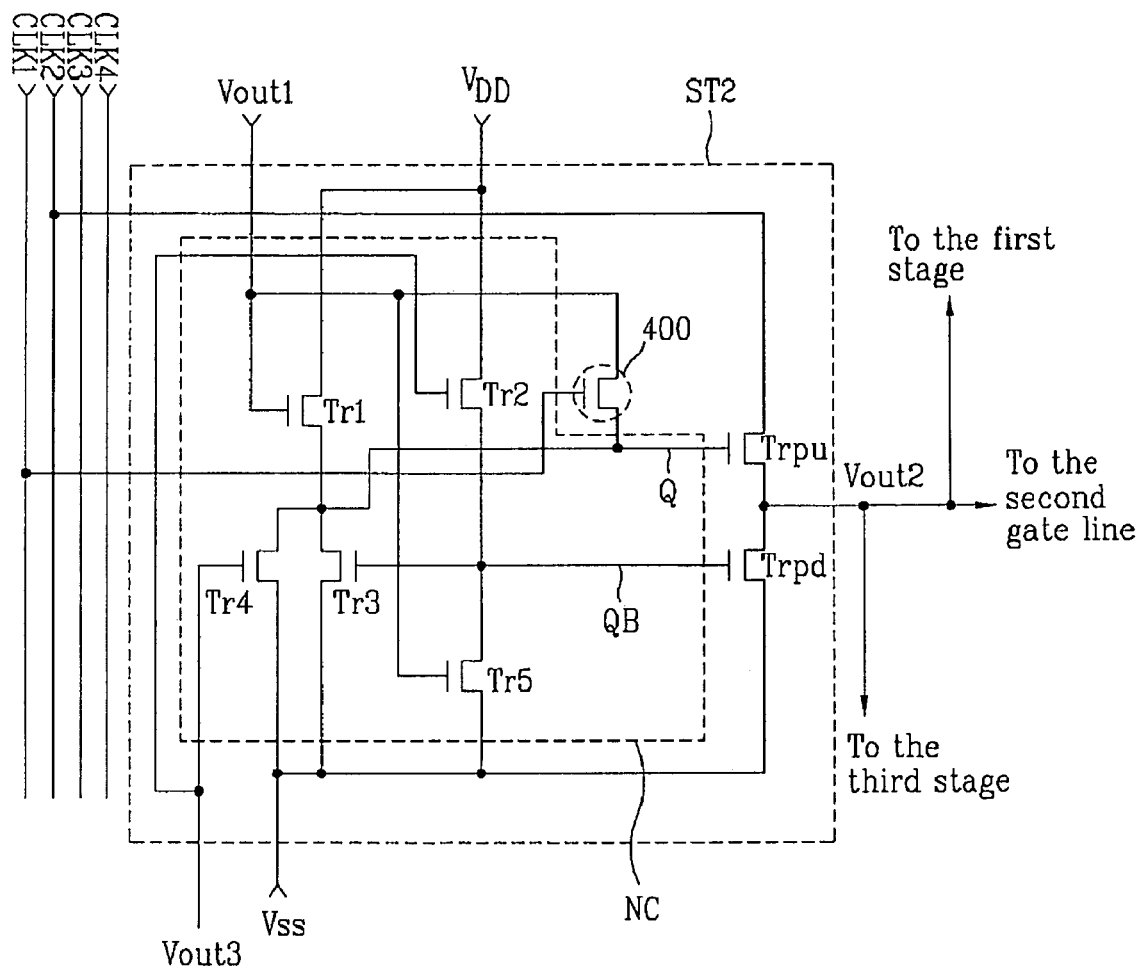
FIG. 14 illustrates the other circuit structure provided in a second stage of FIG. 2.

FIG. 14 illustrates the other circuit structure provided in a second stage of FIG. 2. Each of stages (ST1 to STn+1) is comprised of an enable node (Q); a disable node (QB); a node control unit (NC) which controls the charge and discharge state in the enable node (Q) and the disable node (QB); a pull-up switching unit (Trpu) which outputs an output pulse (Vout) according to the signal state of the enable node (Q); and a pull-down switching unit (Trpd) which outputs a discharging voltage source (VSS) according to the signal state of the disable node (QB). In the same period, the signal state of the enable node (Q) is different from the signal state of the disable node (QB). That is, when the enable node (Q) is maintained in the charge state, the disable node (QB) is maintained in the discharge state. In the meantime, when the enable node (Q) is maintained in the discharge state, the disable node (QB) is maintained in the charge state.

Each stage (ST1 to STn+1) of the aforementioned circuit structure is supplied with the output pulse from the preceding stage, whereby each stage (ST1 to STn+1) charges its own enable node (Q) with the charging voltage source (VDD), and discharges its own disable node (QB) by the discharging voltage source (VSS). Also, each stage (ST1 to STn+1) having the aforementioned circuit structure is supplied with the output pulse from the next stage, whereby each stage (ST1 to STn+1) discharges its own enable node (Q) by the discharging voltage source (VSS), and charges its own disable node (QB) with the charging voltage source (VDD).

The node control unit (NC) is comprised of first to fifth switches (Tr1 to Tr5). In response to the output pulse from the 'k–1'th stage, the first switch (Tr1) included in the 'k'th stage charges the enable node (Q) of the 'k'th stage with the charging voltage source (VDD). For this, the gate terminal of the first switch (Tr1) included in the 'k'th stage is connected with the output terminal of the 'k–1'th stage; the drain terminal is connected with the power transmission line to transmit the charging voltage source (VDD); and the source terminal is connected with the enable node (Q) of the 'k'th stage. For example, the first switch (Tr1) included in the second stage (ST2) of FIG. 14 responds to the first output pulse (Vout1) from the first stage (ST1), whereby the enable node (Q) of the second stage (ST2) is charged with the charging voltage source (VDD).

The second switch (Tr2) included in the 'k'th stage responds to the output pulse from the 'k+1'th stage, whereby the disable node (QB) of the 'k'th stage is charged with the charging voltage source (VDD). For this, the gate terminal of the second switch (Tr2) included in the 'k'th stage is connected with the output terminal of the 'k+1'th stage; the drain terminal is connected with the transmission line to transmit the charging voltage source (VDD); and the source terminal is connected with the disable node (QB) of the 'k'th stage. For example, the second switch (Tr2) included in the second stage (ST2) of FIG. 14 responds to the 'k+1'th output pulse from the 'k+1'th stage, whereby the disable node (QB) of the second stage (ST2) is charged with the charging voltage source (VDD).

The third switch (Tr3) included in the 'k'th stage responds to the charging voltage source (VDD) charged in the disable node (QB) of the 'k'th stage, whereby the enable node (Q) of the 'k'th stage is discharged by the discharging voltage source (VSS). For this, the gate terminal of the third switch (Tr3) included in the 'k'th stage is connected with the disable node (QB) of the 'k'th stage; the drain terminal is connected with the enable node (Q) of the 'k'th stage; and the source terminal is connected with the power transmission line to transmit the discharging voltage source (VSS). For example, the third switch (Tr3) included in the second stage (ST2) of FIG. 14 responds to the charging voltage source (VDD) charged in the disable node (QB) of the second stage (ST2), whereby the enable node (Q) of the second stage (ST2) is discharged by the discharging voltage source (VSS).

The fourth switch (Tr4) included in the 'k'th stage responds to the 'k+1'th output pulse from the 'k+1'th stage, whereby the enable node (Q) of the 'k'th stage is discharged by the discharging voltage source (VSS). For this, the gate terminal of the fourth switch (Tr4) included in the 'k'th stage is connected with the output terminal of the 'k+1'th stage; the drain terminal is connected with the enable node of the 'k'th stage; and the source terminal is connected with the power transmission line to transmit the discharging voltage source (VSS). For example, the fourth switch (Tr4) included in the second stage (ST2) of FIG. 14 responds to the third output pulse (Vout3) from the third stage (ST3), whereby the enable node (Q) of the second stage is discharged by the discharging voltage source (VSS).

The fifth switch (Tr5) included in the 'k'th stage responds to the 'k−1'th output pulse from the 'k−1'th stage, whereby the disable node (QB) of the 'k'th stage is discharged by the discharging voltage source (VSS). For this, the gate terminal of the fifth switch (Tr5) included in the 'k'th stage is connected with the output terminal of the 'k−1'th stage; the drain terminal is connected with the disable node (QB) of the 'k'th stage; and the source terminal is connected with the power transmission line to transmit the discharging voltage source (VSS). For example, the fifth switch (Tr5) included in the second stage (ST2) of FIG. 14 responds to the first output pulse (Vout1) from the first stage (ST1), whereby the disable node (QB) of the second stage (ST2) is discharged by the discharging voltage source (VSS).

In the meantime, the pull-up switching unit (Trpu), the pull-down switching unit (Trpd), and the noise eliminating unit 400 are identical to those explained above. The shift register having the aforementioned circuit structure may be supplied with the start pulse (Vst) and the clock pulses (CLK1 to CLK4) shown in FIG. 3, 6, 7 or 8.

If the start pulse (Vst) and the clock pulses (CLK1 to CLK4) are overlapped and outputted, the 'k'th stage is disabled in response to the 'k+2'th output pulse from the 'k+2'th stage. That is, in response to the 'k+2'th output pulse from the 'k+2'th stage, the 'k'th stage discharges its own enable node (Q) by the discharging voltage source (VSS). For this, the 'k+2'th output pulse from the 'k+2'th stage is supplied to the gate terminal of the second switch (Tr2) included in the 'k'th stage and the gate terminal of the fourth switch (Tr4). If the clock pulses (CLK1 to CLK4) and the start pulse (Vst) are overlapped and outputted, the shift register supplied with the clock pulses (CLK1 to CLK4) and the start pulse (Vst) have two dummy stages. One is the dummy stage to disable the 'n'th stage (STn), and the other is the dummy stage to disable the 'n−1'th stage.

Figure 15:
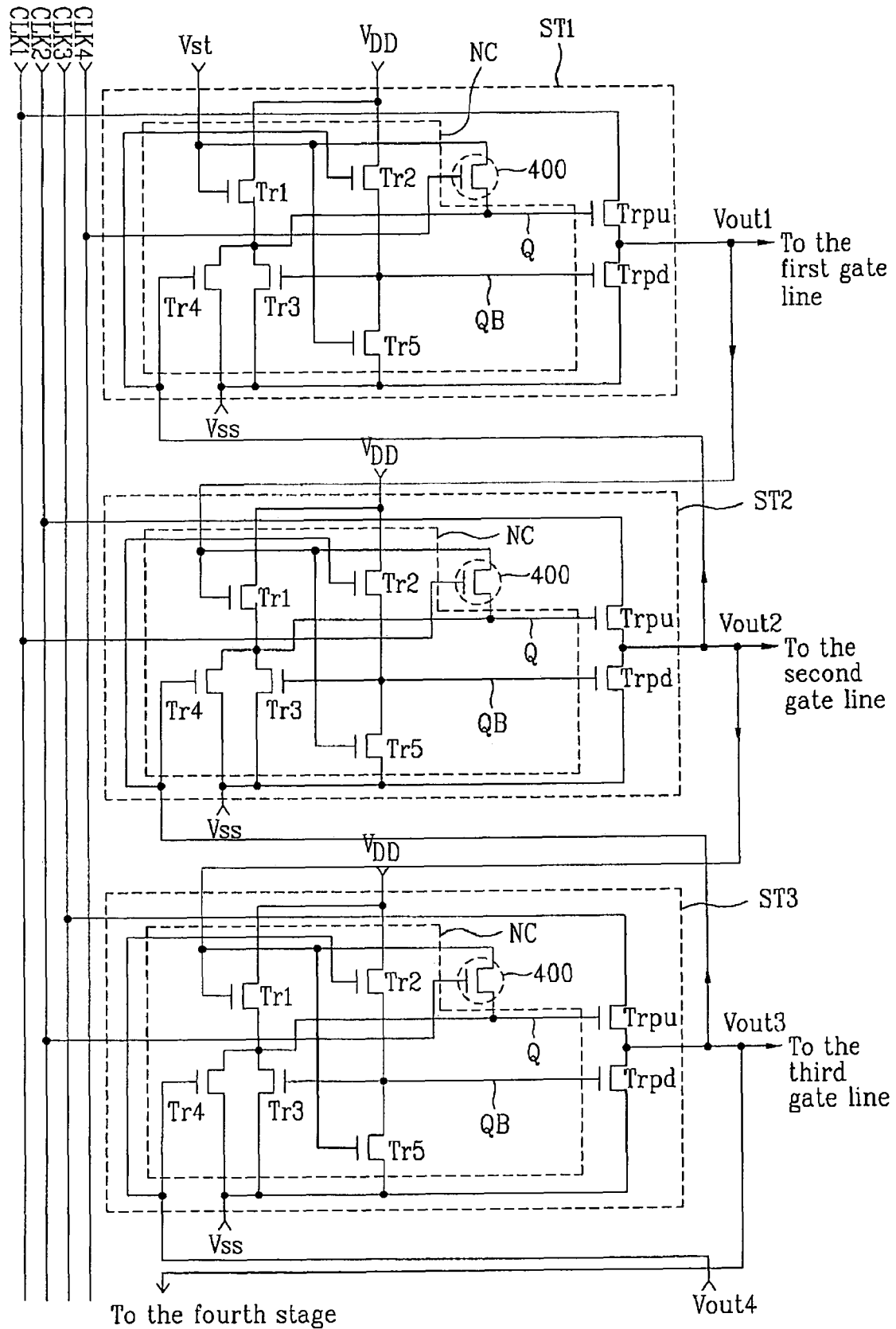
FIG. 15 illustrates first to third stages provided with the circuit structure of FIG. 14.

An operation of the shift register having the aforementioned circuit structure supplied with the start pulse (Vst) and the clock pulses (CLK1 to CLK4) will be explained as follows. FIG. 15 illustrates first to third stages provided with the circuit structure of FIG. 14.

First, an initial period (T0) will be explained as follows. During the initial period (T0), as shown in FIG. 3, the fourth clock pulse (CLK4) and the start pulse (Vst) outputted from a timing controller are maintained in the high state, and the other clock pulses (CLK1, CLK2, CLK3) are maintained in the low state. The start pulse (Vst) outputted from the timing controller is inputted to the first stage (ST1). In detail, the start pulse (Vst) is supplied to the gate terminals of the first and fifth switches (Tr1, Tr5) included in the first stage (ST1) and the drain terminal of the noise eliminating unit 400 included in the first stage (ST1). Thus, the first switch (Tr1) of the first stage (ST1) is turned-on. Through the first switch (Tr1) being turned-on, the charging voltage source (VDD) is supplied to the enable node (Q).

During the initial period (T0), the fourth clock pulse (CLK4) is supplied to the gate terminal of the noise eliminating unit 400 included in the first stage (ST1). Accordingly, the noise eliminating unit 400 is turned-on. Through the noise eliminating unit 400 being turned-on, the start pulse (Vst) is supplied to the enable node (Q). As a result, the enable node (Q) is charged by the charging voltage source (VDD) and the start pulse (Vst) of the high state, thereby turning on the pull-up switching unit (Trpu) having the gate terminal connected with the charged enable node (Q). Also, the fifth switch (Tr5) supplied with the start pulse (Vst) is turned-on. Through the fifth switch (Tr5) being turned-on, the discharging voltage source (VSS) is supplied to the disable node (QB) of the first stage (ST1) Accordingly, the disable node (QB) is discharged by the discharging voltage source (VSS), thereby turning off the pull-down switching unit (Trpd) and the third switch (Tr3) having the gate terminal connected with the discharged disable node (QB). During the initial period (T0), since there are no output pulses from the respective stage (ST1 to STn+1), the fourth switch (Tr4) included in the first stage (ST1) is turned-off.

An operation of the shift register during a first period (T1) will be explained as follows. During the first period (T1), as shown in FIG. 3, the first clock pulse (CLK1) is maintained in the high state, and the start pulse (Vst) and the other clock pulses (CLK2, CLK3, CLK4) are maintained in the low state. In response to the start pulse (Vst) of the low state, the first switch (Tr1) of the first stage (ST1) is turned-off. Also, the noise eliminating unit 400 of the first stage (ST1) is turned-off in response to the fourth clock pulse (CLK4) of the low state. According as the first switch (Tr1) and the noise eliminating unit 400 are turned-off, the enable node (Q) of the first stage (ST1) is maintained in the floating state. As the enable node (Q) of the first stage (ST1) is maintained in the charge state by the charging voltage source (VDD) applied at the initial period (T0), the pull-up switching unit (Trpu) of which gate terminal is connected with the enable node (Q) is maintained in the turn-on state.

At this time, the first clock pulse (CLK1) is applied to the drain terminal of the turned-on pull-up switching unit (Trpu). As shown in FIG. 3, the charging voltage source (VDD) charged in the enable node (Q) of the first stage (ST1) is amplified (bootstrapping). This amplification of the charging voltage source (VDD) occurs because the enable node (Q) is in the floating state. Accordingly, the first clock pulse (CLK1) supplied to the drain terminal of the pull-up switching unit (Trpu) included in the first stage (ST1) is stably outputted through the source terminal of the pull-up switching unit (Trpu). The first clock pulse (CLK1) outputted from the pull-up switching unit (Trpu) corresponds to the first output pulse (Vout1). The first output pulse (Vout1) is supplied to the first gate line, wherein the first output pulse (Vout1) functions as the scan pulse to drive the first gate line. Also, the first output pulse (Vout1) is supplied to the second stage (ST2), wherein the first output pulse (Vout1) functions as the start pulse (Vst) to charge the enable node (Q) of the second stage (ST2) and to discharge the disable node (QB) of the second stage (ST2). That is, the first output pulse (Vout1) from the first stage (ST1) at the first period (T1) is supplied to the gate terminals of the first and fifth switches (Tr1, Tr5) included in the second stage (ST2) and the drain terminal of the noise eliminating unit 400 included in the second stage (ST2). Thus, the first and fifth switches (Tr1, Tr5) of the second stage (ST2) are turned-on.

Also, the first clock pulse (CLK1) of the high state is supplied to the gate terminal of the noise eliminating unit 400 of the second stage (ST2), whereby the noise eliminating unit 400 of the second stage (ST2) is turned-on. During the first period (T1), the noise eliminating unit 400 and the first and fifth switches (Tr1, Tr5) included in the second stage (ST2) are turned-on together. Through the first switch (Tr1) being turned-on, the charging voltage source (VDD) is supplied to the enable node (Q) of the second stage (ST2). Through the noise eliminating unit 400 being turned-on, the first output pulse (Vout1) is supplied to the enable node (Q) of the second stage (ST2). Accordingly, the enable node (Q) of the second stage (ST2) is charged by the charging voltage source (VDD) and the first output pulse (Vout1) of the high state, and the pull-up switching unit (Trpu) of which gate terminal is connected with the charged enable node (Q) is turned-on.

Also, the fifth switch (Tr5) supplied with the first output pulse (Vout1) is turned-on. Through the fifth switch (Tr5) being turned-on, the discharging voltage source (VSS) is supplied to the disable node (QB) of the second stage (ST2). Accordingly, the disable node (QB) is discharged by the discharging voltage source (VSS), thereby turning off the pull-down switching unit (Trpd) and the third switch (Tr3) of which gate terminal is connected with the discharged disable node (QB). During the first period (T1), since there are no output pulses from the third to 'n'th stages (ST3 to STn), the fourth switch (Tr4) included in the first stage (ST1) is turned-off.

An operation of the shift register during a second period (T2) will be explained as follows. During the second period (T2), as shown in FIG. 3, the second clock pulse (CLK2) is maintained in the high state; and the start pulse (Vst), the other clock pulses (CLK1, CLK3, CLK4) and the first output pulse (Vout1) are maintained in the low state. In response to the first output pulse (Vout1) of the low state, the first and fifth switches (Tr1, Tr5) included in the second stage are turned-off. Also, the noise eliminating unit 400 of the second stage (ST2) is turned-off in response to the first clock pulse (CLK1) of the low state. According as the first switch (Tr1) and the noise eliminating unit 400 are turned-off, the enable node (Q) of the second stage (ST2) is maintained in the floating state.

As the enable node (Q) of the second stage (ST2) is maintained in the charge state by the charging voltage source (VDD) applied at the first period (T1), the pull-up switching unit (Trpu) of which gate terminal is connected with the enable node (Q) is maintained in the turn-on state. At this time, the second clock pulse (CLK2) is supplied to the drain terminal of the turned-on pull-up switching unit (Trpu). As shown in FIG. 3, the voltage source charged in the enable node (Q) of the second stage (ST2) is amplified (bootstrapping). Accordingly, the second clock pulse (CLK2) supplied to the drain terminal of the pull-up switching unit (Trpu) included in the second stage (ST2) is stably outputted through the source terminal of the pull-up switching unit (Trpu). The second clock pulse (CLK2) outputted from the pull-up switching unit (Trpu) corresponds to the second output pulse (Vout2).

Then, the second output pulse (Vout2) is supplied to the second gate line, wherein the second output pulse (Vout2) functions as the scan pulse to drive the second gate line. Also, the second output pulse (Vout2) is supplied to the third stage (ST3), wherein the second output pulse (Vout2) functions as the start pulse (Vst) to charge the enable node (Q) of the third stage (ST3) and to discharge the disable node (QB). That is, the second output pulse (Vout2) outputted from the second stage (ST2) at the second period (T2) is supplied to the gate terminals of the first and fifth switches (Tr1, Tr5) included in the third stage (ST3) and the drain terminal of the noise eliminating unit 400. In the same method, the enable node (Q) of the third stage (ST3) is charged and the disable node (QB) of the third stage (ST3) is discharged. That is, the third stage (ST3) is enabled.

In the meantime, the second output pulse (Vout2) outputted from the second stage (ST2) at the second period (T2) is supplied to the first stage (ST1), to thereby discharge the node of the first stage (ST1). That is, the first stage (ST1) is disabled in response to the second output pulse (Vout2) outputted from the second stage (ST2) This will be explained in detail. That is, the second output pulse (Vout2) outputted from the second stage (ST2) at the second period (T2) is supplied to the gate terminal of the fourth switch (Tr4) included in the first stage (ST1). Thus, the fourth switch (Tr4) is turned-on. Through the fourth switch (Tr4) being turned-on, the discharging voltage source (VSS) is supplied to the enable node (Q) of the first stage (ST1). Accordingly, the pull-up switching unit (Trpu) connected with the enable node (Q) of the first stage (ST1) is turned-off.

Also, the second switch (Tr2) of the first stage (ST1) supplied with the second clock pulse (CLK2) at the second period (T2) is turned-on. Through the second switch (Tr2) being turned-on, the charging voltage source (VDD) is supplied to the disable node (QB) of the first stage (ST1). Accordingly, the disable node (QB) is charged, and the pull-down switching unit (Trpd) of which gate terminal is connected with the charged disable node (QB) is turned-on. Through the pull-down switching unit (Trpd) being turned-on, the discharging voltage source (VSS) is supplied to the first gate line, thereby discharging the first gate line. During the second period (T2), the second stage (ST2) outputs the second output pulse (Vout2). The second output pulse (Vout2) drives the second gate line; enables the third stage (ST3); and disables the first stage (ST1). In the same method, the third stage (ST3) outputs the third output pulse (Vout3) at the third period (T3), and the fourth stage (ST4) outputs the fourth output pulse (Vout4) at the fourth period (T4).

In the meantime, the fourth clock pulse (CLK4) outputted at the fourth period (T4) is supplied to the first stage (ST1). That is, the fourth clock pulse (CLK4) is supplied to the noise eliminating unit 400 of the first stage (ST1). The noise eliminating unit 400 is turned-on by the fourth clock pulse (CLK4). Through the noise eliminating unit 400 being turned-on, the start pulse (Vst) is supplied to the enable node (Q) of the first stage (ST1). Since the start pulse (Vst) is maintained as the low state during the other periods except the initial period (T0), the fourth period (T4) is supplied with the start pulse (Vst) of the low state. Accordingly, the enable node (Q) of the first stage (ST1) at the fourth period is discharged by the start pulse (Vst) of the low state.

The fourth clock pulse (CLK4) is maintained in the high state every period of '4p+4' ('p' is an integer including '0') including the initial period (T0). Thus, the noise eliminating unit 400 of the first stage (ST1) supplied with the fourth clock pulse (CLK4) is turned-on every period of '4p+4' (T4, T8, . . . ) including the initial period (T0). At this time, the noise eliminating unit 40 being turned-on selectively outputs any one of the high-state start pulse (Vst) and the low-state start pulse (Vst). That is, the initial period (T0) corresponds to the point (charge period) in which the enable node (Q) of the first stage (ST1) is charged. During the initial period (T0), both the start pulse (Vst) and the fourth clock pulse (CLK4) are maintained in the high state. Accordingly, the noise eliminating unit 400 charges the enable node (Q) of the first stage (ST1) with the start pulse (Vst) of the high state during the initial period (T0).

After the initial period (T1), the periods of '4p+4' (T4, T8, . . . ) correspond to the point in which the enable node is discharged. During the periods of '4p+4' (T4, T8, . . . ), the start pulse (Vst) is maintained in the low state, and the fourth clock pulse (CLK4) is maintained in the high state. Accordingly, the noise eliminating unit 400 discharges the enable node (Q) of the first stage (ST1) by the start pulse (Vst) of the low state during the periods of '4p+4'. In this method, the noise eliminating unit 400 included in each of the other stages charges and discharges the enable node (Q) of the corresponding stage.

Figure 16:
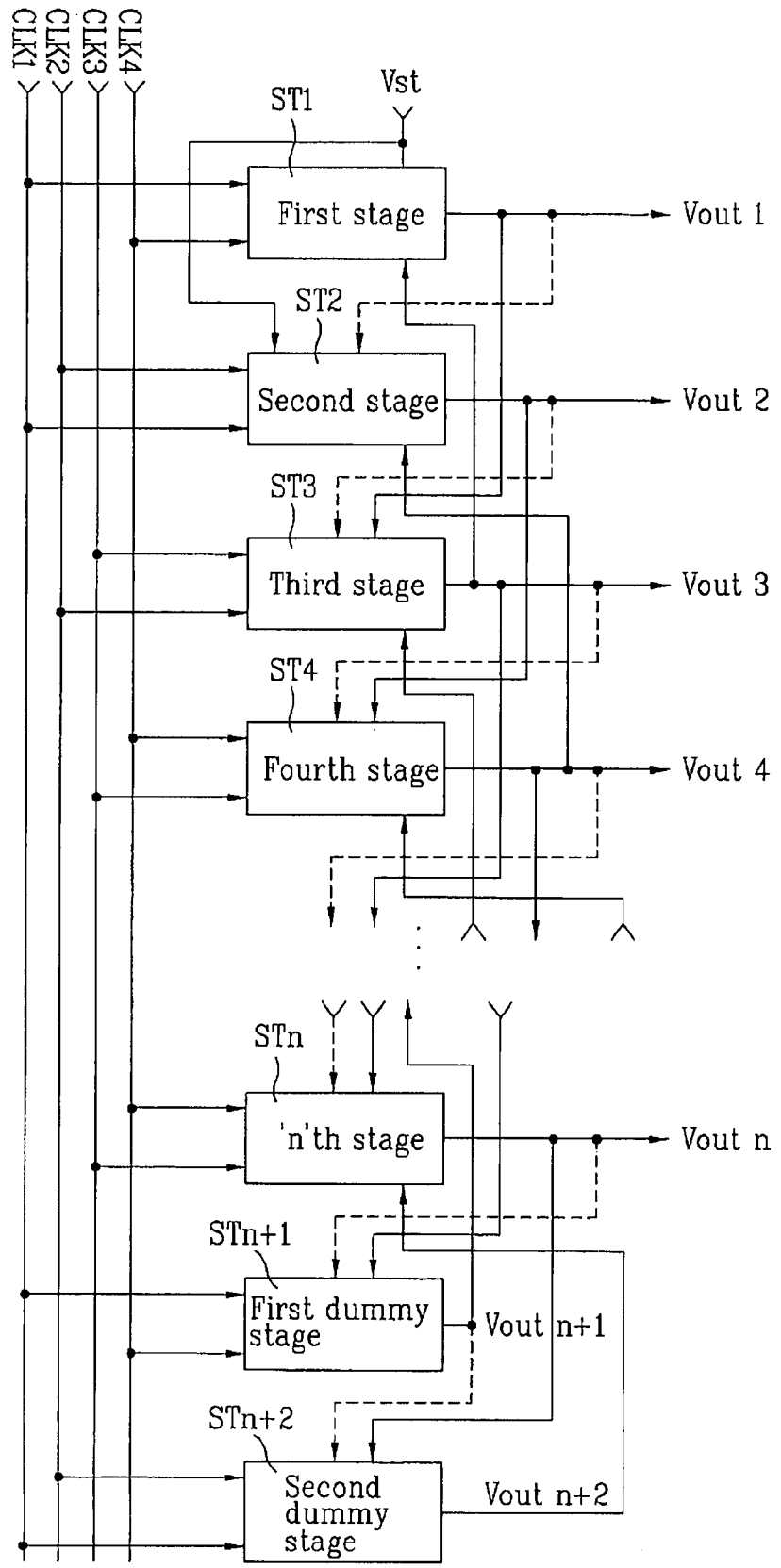
FIG. 16 illustrates a shift register according to the second embodiment of the present invention.

FIG. 16 illustrates a shift register according to the second embodiment of the present invention. As shown in FIG. 16, the shift register according to the second embodiment of the present invention is comprised of 'n' stages (ST1 to STn) subordinately connected with one another, and first and second dummy stages (STn+1, STn+2). Each of the stages (ST1 to STn+2) is supplied with two clock pulses with the phase difference among first to fourth clock pulses (CLK1 to CLK4). At this time, the first to fourth clock pulses (CLK1 to CLK4) are outputted based on the timing view of FIG. 6.

Each of the stages (ST1 to STn+2) included in the shift register according to the second embodiment of the present invention is supplied with the two clock pulses, wherein one is required to output the output pulse from each of the stages (ST1 to STn+2), and the other is required to control a noise eliminating unit 400 included in each of the stages (ST1 to STn+2).

To make each of the stages (ST1 to STn+2) output the output pulse, an enable node (Q) of each of the stages (ST1 to STn+2) is charged previously (that is, enable operation). For this, each of the stages (ST1 to STn+2) is supplied with the output pulse from the corresponding one positioned two stages ahead thereof, whereby each of the stages (ST1 to STn+2) charges its own enable node (Q). That is, in response to the output pulse from the 'k–2'th stage, the 'k'th stage charges the enable node (Q) of the 'k'th stage with the charging voltage source (VDD). At this time, since there is no stage prior to the first stage (ST1) which is the uppermost one, the first and second stages (ST1, ST2) are supplied with the start pulse (Vst) from a timing controller, so that the first and second stages (ST1, ST2) charge their own enable nodes with the charging voltage source (VDD). In response to the output pulse from the corresponding one positioned two stages behind, each of the stages (ST1 to STn+2) discharges its own enable node (Q). For example, in response to the output pulse from the 'k+2'th stage, the 'k'th stage discharges the enable node (Q) of the 'k'th stage by the discharging voltage source (VSS).

Each of the stages (ST1 to STn+2) is supplied with the output pulse outputted from the preceding stage, thereby periodically discharging the enable node (Q) included in the stage. For this, each of the stages is supplied with the output pulse of the preceding stage which is positioned prior to the corresponding stage. For example, the 'k'th stage is supplied with the output pulse from the 'k–1'th stage, thereby periodically discharging the enable node (Q) of the 'k'th stage.

In the meantime, each of the stages (ST1 to STn+2) is supplied with the additional clock pulse, to thereby control its own pull-down switching unit (Trpd).

The second dummy stage (STn+2) disables the 'n'th stage (STn) which outputs the last output pulse (output pulse to drive the gate line) during one frame. Also, the first dummy stage disables the 'n–1'th stage positioned prior to the 'n'th stage.

The other stages except the first and second stages (ST1, ST2) are supplied with the start pulse (Vst). Although not shown, the start pulse (Vst) supplied to the other stages (ST3 to STn+2) except the first and second stages (ST1, ST2) discharges the enable nodes (Q) of the stages (ST3 to STn+2) at the same time. This start pulse (Vst) discharges the residual voltage which may be charged in the enable nodes (Q) of the stages (ST3 to STn+2) after one frame, thereby realizing the stable operation of the shift register. For this, the other stages (ST3 to STn+2) except the first and second stages (ST1, ST2) are different from the first and second stages (ST1, ST2) in structure. This will be explained later.

The circuit structure for each of the stages (ST1 to STn+2) will be explained as follows.

Figure 17:
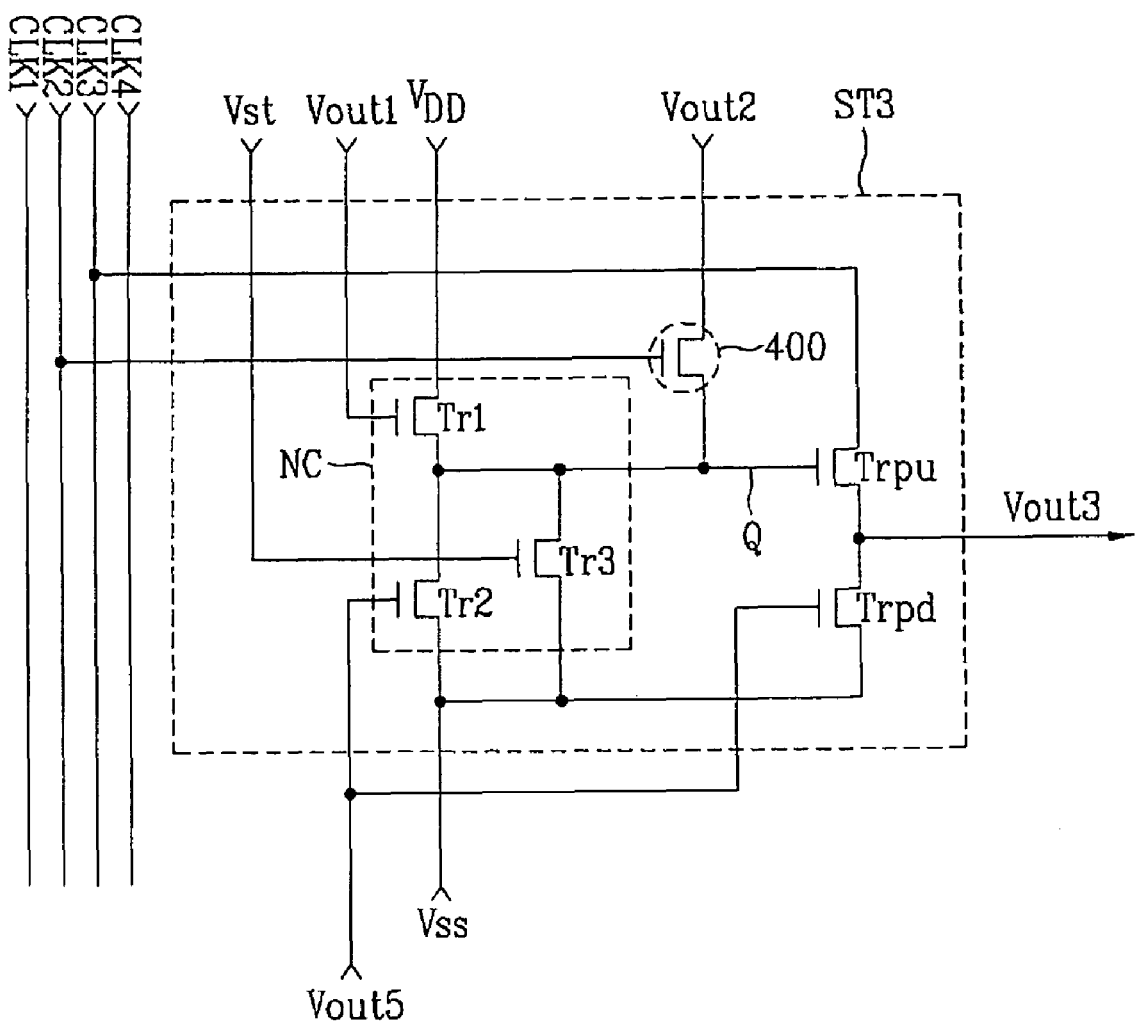
FIG. 17 illustrates one circuit structure provided in a third stage of FIG. 16.

FIG. 17 illustrates one circuit structure provided in a third stage of FIG. 16. As shown in FIG. 17, each stage (ST1 to STn+2) is comprised of the enable node (Q); a node control unit (NC) which controls the signal stage of the enable node (Q); a pull-up switching unit (Trpu) which outputs an output pulse according to the signal state of the enable node (Q); a pull-down switching unit (Trpd) which discharges an output terminal of the pull-up switching unit (Trpu) in response to the output pulse outputted from the corresponding one positioned two stages behind; and a noise eliminating unit 400 which periodically discharges the enable node (Q). At this time, the node control unit (NC) comprises first to third switches (Tr1, Tr2, Tr3).

The first switch (Tr1) included in the node control unit (NC) of the 'k'th stage responds to the output pulse of the 'k–2'th stage, to thereby charge the enable node (Q) of the 'k'th stage with the charging voltage source (VDD). For this, a gate terminal of the first switch (Tr1) included in the node control unit (NC) of the 'k'th stage is connected with an output terminal of the 'k–2'th stage; a drain terminal of the first switch (Tr1) is connected with a power transmission line to transmit the charging voltage source (VDD); and a source terminal of the first switch (Tr1) is connected with the enable node (Q) of the 'k'th stage. For example, the first switch (Tr1) included in the third stage (ST3) of FIG. 17 responds to the first output pulse (Vout1) of the first stage (ST1), to thereby charge the enable node (Q) of the third stage (ST3) with the charging voltage source (VDD). However, since there is no stage prior to the first stage (ST1), the first switch (Tr1) included in the first stage (ST1) responds to the start pulse (Vst) outputted from the timing controller, thereby charging the enable node (Q) of the first stage (ST1) with the charging voltage source (VDD).

Ahead of the secondly preceding stage from the second stage, there is no stage. Thus, the first switch (Tr1) included in the second stage (ST2) responds to the start pulse (Vst) outputted from the timing controller, thereby charging the enable node (Q) of the second stage (ST2) by the charging voltage source (VDD).

The second switch (Tr2) included in the node control unit (NC) of the 'k'th stage responds to the output pulse from the 'k+2'th stage, thereby discharging the enable node (Q) of the 'k'th stage by the discharging voltage source (VSS). For this, the gate terminal of the second switch (Tr2) included in the node control unit (NC) of the 'k'th stage is connected with the output terminal of the 'k+2'th stage; the drain terminal is connected with the enable node (Q) of the 'k'th stage; and the source terminal is connected with the power transmission line to transmit the discharging voltage source (VSS). For example, the second switch (Tr2) included in the third stage (ST3) of FIG. 17 responds to the fifth output pulse (Vout5) from the fifth stage (ST5), thereby discharging the enable node (Q) of the third stage (ST3) by the discharging voltage source (VSS).

The third switch (Tr3) included in the node control unit (NC) of the 'k'th stage responds to the start pulse (Vst) from the timing controller, thereby discharging the enable node (Q) of the 'k'th stage by the discharging voltage source (VSS). In the first and second stages (ST1, ST2), there is no third switch (Tr3). For this, the gate terminal of the third switch included in the node control unit (NC) of the 'k'th stage is connected with the output terminal of the timing controller; the drain terminal is connected with the enable node (Q) of the 'k'th stage; and the source terminal is connected with the power transmission line to transmit the discharging voltage source (VSS). For example, the third switch (Tr3) included in the third stage (ST3) of FIG. 17 responds to the start pulse (Vst) from the timing controller, whereby the enable node (Q) of the third stage (ST3) is discharged by the discharging voltage source (VSS).

The pull-down switching unit (Trpd) may be supplied with any one of the first to fourth clock pulses (CLK1 to CLK4) instead of the output pulse. In detail, the clock pulse supplied to the pull-down switching unit (Trpd) included in the 'k'th stage is identical to the clock pulse supplied to the pull-up switching unit (Trpu) included in the 'k+2'th stage. For example, the pull-down switching unit (Trpd) included in the third stage (ST3) of FIG. 17 responds to the first clock pulse (CLK1), thereby discharging the enable node (Q) of the third stage (ST3) by the discharging voltage source (VSS). The noise eliminating unit 400 is identical to that of FIG. 3, of which detailed explanation will be omitted. In the meantime, the first and second stages (ST1, ST2) enabled by the start pulse (Vst) has no third switch (Tr3).

An operation of the shift register according to the second embodiment of the present invention is identical to that of the shift register supplied with the first to fourth clock pulses (CLK1 to CLK4) of FIG. 6, whereby the detailed explanation will be omitted.

Figure 18:
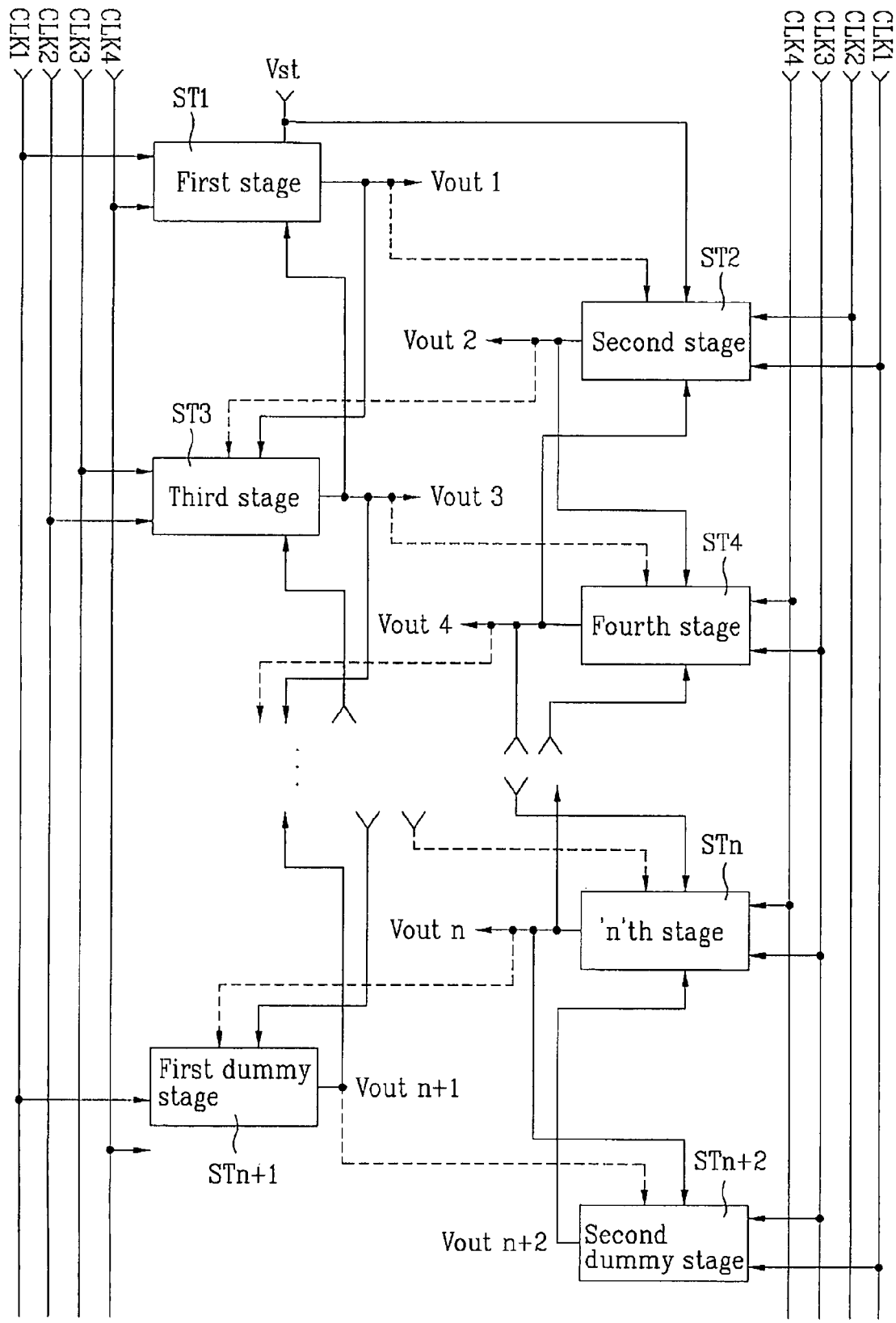
FIG. 18 illustrates a shift register according to the third embodiment of the present invention.

FIG. 18 illustrates a shift register according to the third embodiment of the present invention.

The shift register according to the third embodiment of the present invention shown in FIG. 18 is identical in structure to the shift register shown in FIG. 15.

However, odd-numbered stages (ST1, ST3, . . . , STn+1) are positioned in the left side of the shift register, and even-numbered stages (ST2, ST4, . . . , STn+2) are positioned in the right side of the shift register. The odd-numbered stages (ST1, ST3, . . . , STn+1) drive odd-numbered gate lines, and the even-numbered stages (ST2, ST4, . . . , STn+2) drive even-numbered gate lines.

The odd-numbered stages (ST1, ST3, . . . , STn+1) are supplied with any two among first to fourth clock pulses, and the even-numbered stages (ST2, ST4, . . . , STn+2) are supplied with any two among the first to fourth clock pulses. The first to fourth clock pulses (CLK1 to CLK4) are outputted with the timing view of FIG. 6.

The noise eliminating unit 400 included in the odd-numbered stage (ST1, ST3, . . . , STn+1) is supplied with the output pulse from the even-numbered stage (ST2, ST4, . . . , STn+2) which is positioned prior to the odd-numbered stage (ST1, ST3, . . . , STn+1). Also, the noise eliminating unit 400 included in the even-numbered stage (ST2, ST4, . . . , STn+2) is supplied with the output pulse from the odd-numbered stage (ST1, ST3, . . . , STn+1) which are positioned prior to the even-numbered stage (ST2, ST4, . . . , STn+2). At this time, the output pulse outputted from the odd-numbered stage (ST1, ST3, . . . , STn+1) is supplied to the noise eliminating unit 400 of the even-numbered stage (ST2, ST4, . . . , STn+2) through the odd-numbered gate line. Also, the output pulse outputted from the even-numbered stage (ST2, ST4, . . . , STn+2) is supplied to the odd-numbered stage (ST1, ST3, . . . , STn+1) through the even-numbered gate line.

For example, the first output pulse (Vout1) outputted from the first stage (ST1) is supplied to the noise eliminating unit 400 of the second stage (ST2) through the first gate line. Also, the second output pulse (Vout2) outputted from the second stage (ST2) is supplied to the noise eliminating unit 400 of the third stage (ST3) through the second gate line.

Each stage (ST1 to STn+2) may have the circuit structure shown in FIGS. 4, 9, 11, 14 and 17.

Figure 19:
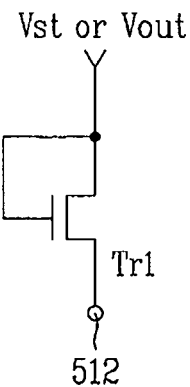
FIG. 19 illustrates other circuit structures of first switch shown in FIGS. 4, 9, 11, 13 and 16.
Figure 19:
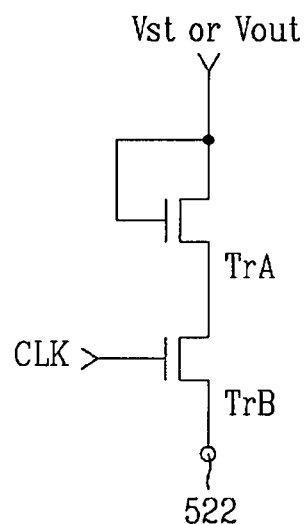
Figure 19:
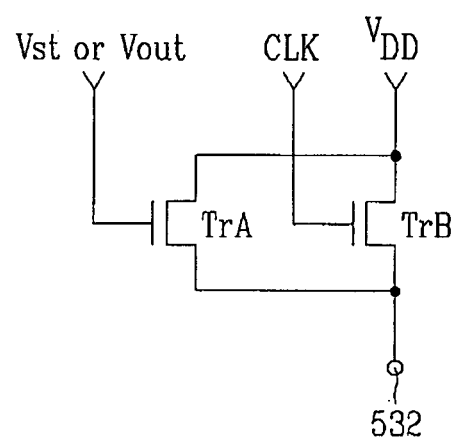

FIG. 19 illustrates other circuit structures of first switching unit shown in FIGS. 4, 9, 11, 13 and 17.

First, as shown in (a) of FIG. 19, the first switch (Tr1) shown in FIGS. 4, 9, 11, 13 and 17 may have the diode type. In response to the start pulse (Vst) outputted from the timing controller or the output pulse (Vout) outputted from the preceding stage, the first switch (Tr1) charges the enable node (Q) with the start pulse (Vst) or the output pulse (Vout). The terminal 512 shown in (a) of FIG. 19 is connected with the enable node (Q).

As shown in (b) of FIG. 19, the first switch (Tr1) shown in FIGS. 4, 9, 11, 14 and 17 may be comprised of 'A' and 'B' switches (TrA, Trb) connected in series. At this time, the 'A' switch (TrA) may have the aforementioned diode type, wherein the drain terminal of the 'B' switch (TrB) is connected with the source terminal of the 'A' switch (TrA). The gate and drain terminals of the 'A' switch (TrA) are supplied with the start pulse (Vst) outputted from the timing controller or the output pulse (Vout) outputted from the preceding stage. Also, the gate terminal of the 'B' switch (TrB) is supplied with the clock pulse (CLK) which is synchronized with the start pulse (Vst) or output pulse (Vout) supplied to the 'A' switch (TrA). In response to the start pulse (Vst) and clock pulse (CLK), or the output pulse (Vout) and clock pulse (CLK), the first switch (Tr1) charges the enable node (Q) with the start pulse (Vst) or the output pulse (Vout). The terminal 522 shown in (b) of FIG. 15 is connected with the enable node (Q).

As shown in (c) of FIG. 19, the first switch (Tr1) shown in FIGS. 4, 9, 11, 14 and 17 may be comprised of 'A' and 'B' switches (TrA, TrB) connected in parallel. At this time, the 'A' switch (TrA) outputs the charging voltage source (VDD) in response to the start pulse (Vst) or the output pulse (Vout) outputted from the preceding stage. Also, the 'B' switch (TrB) outputs the charging voltage source (VDD) in response to the clock pulse (CLK). The drain terminal of the 'A' switch (TrA) is connected with the drain terminal of the 'B' switch (TrB), and the source terminal of the 'A' switch (TrA) is connected with the source terminal of the 'B' switch (TrB). The clock pulse (CLK) is synchronized with the start pulse (Vst) or the output pulse (Vuot). The terminal 532 shown in (c) of FIG. 19 is connected with the enable node (Q).

As mentioned above, the shift register according to the preferred embodiment of the present invention has the following advantages.

The shift register according to the preferred embodiment of the present invention has the respective stages, wherein each of the stages has the noise eliminating unit. The noise eliminating unit supplies the output pulse outputted from the preceding stage to the enable node, thereby periodically discharging the enable node.

Accordingly, it is possible to prevent the enable node from being charged by the coupling phenomenon.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising:
   first to k-th clock transmission lines (k being an integer greater than 1) to transmit a first to k-th clock pulses with phase difference, each having a first pulse width, wherein the first to k-th clock pulses outputted in the adjoining periods are maintained as an overlapped active state of a predetermined time together;

first to k-th reset clock transmission lines to transmit first to k-th reset clock pulses with phase difference, each having a second pulse width, wherein the i-th reset clock pulse (i being an integer of the first to k) is maintained in an active state at a period between a rising edge to the active state of the previously outputted i-th clock pulse and a rising edge to the active state of the subsequently outputted (i+1)-th clock pulse, and is changed to an inactive state within the overlapped active state of the predetermined time, and wherein the first pulse width is larger than the second pulse width; and first to m-th stages (m being an integer greater than 1) to receive one of the first to k-th clock pulses and one of the first to k-th reset clock pulses respectively from the-clock transmission lines and the reset clock transmission lines, and to output respective output signals in sequence, wherein the n-th stage (n being any integer from 1 to m) comprises:

a noise eliminating unit to supply a start pulse externally provided or an output signal provided from the (n-p)-th stage (p being an integer smaller than the n) to an enable node according to the one of the first to k-th reset clock pulses; and a pull-up switching unit to receive the one of the first to k-th clock pulses and to output the n-th output signal according to a signal state of the enable node;

a pull-down switching unit to maintain the n-th output signal substantially at a discharging voltage according to the other one of the first to k-th clock pulses which is delayed than the clock pulse supplied to the pull-up switching unit of the n-th stage;

wherein each of the stages comprises a first switch which charges the enable node of the current stage in response to the start pulse externally provided or the output-signal provided from the preceding stage.

2. The shift register of claim 1, wherein the n-th output signal is supplied to an (n+p)-th stage so as to enable the (n+p)-th stage.

3. The shift register of claim 1, wherein the (n+1)-th stage includes a noise eliminating unit to receive the other one of the first to k-th reset clock pulses.

4. The shift register of claim 1, further comprising comprises a second switch which discharges the enable node of the current stage in response to the output pulse outputted from the next stage.

5. The shift register of claim 4, wherein the first switch included in the 'n'th stage charges the enable node of the 'n'th stage in response to the output-signal from the 'n−1'th stage; and the second switch included in the 'n'th stage discharges the enable node of the 'n'th stage in response to the output-signal from the 'n+m'th stage ('m' is an integer).

* * * * *